(12) United States Patent
Nii et al.

(10) Patent No.: US 7,815,343 B2
(45) Date of Patent: Oct. 19, 2010

(54) LIGHT EMITTING DEVICE

(75) Inventors: Ikuya Nii, Anan (JP); Hiroaki Ukawa, Tokushima (JP); Nobuhide Kasae, Tokushima (JP); Toshimasa Takao, Tokushima (JP)

(73) Assignee: Nichia Corporation, Anan-shi (JP)

( * ) Notice: Subject to any disclaimer, the term of this patent is extended or adjusted under 35 U.S.C. 154(b) by 497 days.

(21) Appl. No.: 11/882,603

(22) Filed: Aug. 2, 2007

(65) Prior Publication Data
US 2008/0037252 A1    Feb. 14, 2008

(30) Foreign Application Priority Data
Aug. 4, 2006    (JP)    .......................... P2006-213929

(51) Int. Cl.
*F21V 3/00*    (2006.01)
(52) U.S. Cl. .......................... 362/311.03; 362/249.02; 362/255; 362/256; 362/267; 362/311.02; 362/311.04; 257/98; 257/99; 257/100
(58) Field of Classification Search .................. 362/267, 362/311.02, 231, 249.02, 255, 256, 293, 362/311.03, 311.04; 313/502; 427/64; 257/98, 257/99, 100
See application file for complete search history.

(56) References Cited

U.S. PATENT DOCUMENTS

| | | | |
|---|---|---|---|
| 6,610,563 B1 * | 8/2003 | Waitl et al. .................. 438/166 |
| 7,210,807 B2 * | 5/2007 | Sakamoto et al. ............. 362/84 |
| 7,517,728 B2 * | 4/2009 | Leung et al. ................. 438/122 |
| 7,554,129 B2 * | 6/2009 | Roth et al. ................... 257/100 |
| 7,592,639 B2 * | 9/2009 | Maeda et al. ................. 257/98 |
| 2004/0051111 A1 * | 3/2004 | Ota et al. ..................... 257/98 |
| 2005/0173713 A1 * | 8/2005 | Lin et al. ..................... 257/81 |
| 2005/0280354 A1 * | 12/2005 | Liu ............................. 313/502 |
| 2006/0022215 A1 | 2/2006 | Arndt et al. |
| 2006/0022580 A1 * | 2/2006 | Jermann et al. ............. 313/501 |
| 2006/0255716 A1 * | 11/2006 | Tsutsumi et al. ............ 313/502 |
| 2007/0019416 A1 * | 1/2007 | Han et al. .................... 362/307 |

FOREIGN PATENT DOCUMENTS

JP    2006-516816 A    7/2006

* cited by examiner

*Primary Examiner*—Sandra L O'Shea
*Assistant Examiner*—Mary Zettl
(74) *Attorney, Agent, or Firm*—Birch, Stewart, Kolasch & Birch, LLP

(57) ABSTRACT

The present invention provides a light emitting device which has high reliability and long service life by suppressing the sealing resin from peeling off the inner edge of the opening of the recess of the housing.

The light emitting device of the present invention comprises a light emitting element having a pair of electrodes, a housing having a recess for accommodating the light emitting element, a first lead electrode and a second lead electrode which are exposed on the bottom of the recess, electrically conductive members for electrically connecting the pair of electrodes of the light emitting element to the first lead electrode and to the second lead electrode respectively, a transparent sealing material which fills in the recess and granular additives contained in the sealing material, wherein the inner wall surface of the recess has a light blocking section that blocks light emitted by the light emitting device toward the inner edge of the opening of the recess, the quantity of the granular additives contained in the sealing material is controlled to such a level that enhances scattering of light in a first region located below the light blocking section and to such a level that suppresses scattering of light in a second region located above the light blocking section.

19 Claims, 14 Drawing Sheets

X - X

Y-Y

LIGHT EMITTING DEVICE

BACKGROUND OF THE INVENTION

1. Field of the Invention

The present invention relates to a light emitting device, and particularly to a light emitting device having high heat resistance and high durability.

2. Description of the Related Art

Among light emitting devices that employ light emitting elements such as light emitting diode, a light emitting device having a housing which protects the to the light emitting element is known. The housing has a recess formed on the light emitting side thereof so that, after the light emitting element is mounted in the recess, the recess is filled with a transparent sealing material for the protection of the light emitting element from the environment.

The housing is formed from an electrically insulating resin which is appropriate for electrically and mechanically protecting the light emitting element. For example, a nylon-based resin such as polyphthalamide or polyamide, a liquid crystal polymer, or an epoxy-based resin is preferably used.

For the sealing material, such a material is used that has translucency and good bonding with the housing, and an epoxy resin is commonly used. While the epoxy resin is known to undergo deterioration and discoloration to become yellowish when exposed to light and/or heat over an extended period of time, this problem may be negligible if used in a light emitting device of which intensity of light emission is not high and heat generation is low.

However, as light emitting devices are manufactured with increasingly higher output power, the epoxy resin used as the sealing material undergoes more significant yellowing, which results in a decrease in the light transmittance of the epoxy resin. As a result, efficiency of extracting light from the light emitting device decreases. In the case of a light emitting device which emits light of shorter wavelength, in particular, yellowing due to the deterioration and decrease in the light transmittance become substantial. While service life of the light emitting device has been increasing, there has been such a problem that the epoxy resin has lower durability than the other components of the light emitting device.

Accordingly, it has been proposed to use a silicone resin, which is transparent and is less vulnerable to deterioration due to light and heat, instead of the epoxy resin as the sealing material (for example, refer to Kohyo (National Publication of Translated Version) No. 2006-516816). The silicone resin has siloxane bond of high bonding energy in the backbone of base polymer, and is one of resins which have high heat resistance and high weatherability. The silicone resin also has high light transmittance, and is regarded as a promising sealing material to be used in light emitting devices of high output power.

However, the silicone resin which has high translucency and high durability also as a drawback of low bonding with the housing. That is, when the silicone resin is used as the sealing material, it may peel off first in the inner edge of opening of the recess and then in the inner portion of the recess, due to the mechanical and thermal stresses caused between the housing and the sealing material. In the worst case, the sealing resin may completely fall off the housing.

As a technique to solve this problem, it is known to provide a wall around the recess of the housing and a ring-shaped trench between the wall and the inner edge of the opening (for example, refer to Kohyo (National Publication of Translated Version) No. 2006-516816). The sealing material is provided to fill not only the recess of the housing but also the trench, so as to serve as an anchor ring. In this housing, the wall is formed so that the top of the wall is lower than the light emitting surface of the housing when viewed from the bottom of the recess.

Peel-off between the inner edge of the opening of the recess of the housing and the sealing material may lead to the infiltration of moisture and impurities into the light emitting device, as well as to causing the separation of the sealing material to start. When moisture or other impurity which has infiltrated through a peeling gap deposits on the inner surface of the recess, reflectivity of the housing decreases which results in decreasing efficiency of extracting light from the light emitting device. When the impurity reaches the light emitting element, the light emitting device may fail to function. The technology disclosed in Kohyo (National Publication of Translated Version) No. 2006-516816 may suppress the sealing member from peeling off in the interface with the housing and falling off, although it is unable to prevent peel-off on the inner edge of the opening of the recess of the housing.

In case the silicone resin is used for the sealing resin, in particular, the problem of moisture or other impurity infiltrating through a peeling gap becomes serious, since the silicone resin has higher expansion coefficient than the housing. As the temperature of the light emitting device rises during operation, the silicone resin expands more than the housing and swells outwardly from the inner edge of the opening of the recess of the housing. In case there is a gap between the sealing resin and the inner edge of the opening of the recess of the housing due to peeling, the sealing resin bulges out of the housing as the temperature of the light emitting device rises. Then, the sealing resin returns within the housing as the temperature decreases. As this thermal cycle is repeated, bonding between the sealing resin and the inner edge of the opening of the recess of the housing is lost, thus allowing impurities to enter through the gap.

SUMMARY OF THE INVENTION

An object of the present invention is to provide a light emitting device which has high reliability and long service life, and is capable of suppressing impurities from entering the light emitting device by suppressing the sealing resin from peeling off the inner edge of the opening of the recess of the housing.

The present invention is based on a finding that exfoliation of the sealing resin from the inner edge of the opening of the recess of the housing is accelerated significantly by the deterioration of the material forming the inner edge of the opening, and the deterioration is caused to proceed by the light emission from the light emitting device. Accordingly, the present invention is intended to suppress the deterioration of the material forming the inner edge of the opening by reducing light emission which illuminates the inner edge of the opening of the recess of the housing, thereby to suppress the sealing resin from peeling off the inner edge of the opening.

In the conventional light emitting device, too, it has been attempted to reduce direct illumination of the inner wall surface of the recess of the housing by the light emitted by the light emitting device, by scattering the light directly coming from the light emitting element by means of fluorescent material particles added in the sealing resin or a filler contained in the resin for the adjustment of viscosity. The fluorescent material particles absorb light emitted by the light emitting device and emit light in the radiating direction, and therefore have significant effect of reducing the intensity of light directly incident on the inner wall surface. However, scatter by the granular particles added in the resin is not enough to suppress the sealing resin from peeling off the inner edge of the opening of the recess.

The present invention provides a light emitting device which enhances the blocking of light directly directed toward the inner edge of the opening in the inner wall surface of the recess, while exhibiting ordinary light diminishing effect as in the prior art for light directly incident on the other portion of the inner wall.

First, light emitting device of the present invention comprises a light emitting element having a pair of electrodes, a housing having a recess for accommodating the light emitting element, a first lead electrode and a second lead electrode which are exposed on the bottom of the recess, electrically conductive members for electrically connecting the pair of electrodes of the light emitting element to the first lead electrode and to the second lead electrode respectively, a transparent sealing material which fills in the recess and granular additives contained in the sealing material, wherein the inner wall surface of the recess has a light blocking section that blocks light emitted by the light emitting device from directly illuminating the inner edge of the opening of the recess, quantity of the granular additives contained in the sealing material is controlled to such a level that enhances scattering of light in a first region located below the light blocking section and to such a level that suppresses scattering of light in a second region located above the light blocking section.

In the first light emitting device of the present invention, the light blocking section is disposed so as to prevent the inner edge of the opening from being directly illuminated by the light emitted by the light emitting device. As a result, the light emitted by the light emitting device is prevented by the light blocking section from directly reaching the inner edge of the opening, so that deterioration of the material in the inner edge of the opening is suppressed very effectively.

As the quantity of the granular additives contained in the sealing material that fills the first region located below the light blocking section is controlled to such a level that is enough to scatter light, and therefore it is made possible to scatter the light directly coming from the light emitting device, and reduce direct illumination of the inner wall surface of the recess of the housing by light from the light emitting device. Also, as the quantity of the granular additives contained in the sealing material that fills the second region located above the light blocking section is controlled to such a level that has no significant effect on the scattering of light, it is made possible to suppress light which has been scattered by the granular additives contained in the sealing material that fills the second region from reaching the inner edge of the opening and thereby suppressing the material forming the inner edge of the opening from degrading.

As used herein, the phrase "to block light" means, in addition to complete blocking of light from the light emitting element directed toward the inner edge of the opening, partial blocking of light as well.

Second, light emitting device of the present invention comprises a light emitting element having a pair of electrodes, a housing having a recess for accommodating the light emitting element, a first lead electrode and a second lead electrode which are exposed on the bottom of the recess, electrically conductive members for electrically connecting the pair of electrodes of the light emitting element to the first lead electrode and to the second lead electrode respectively, a transparent sealing material which fills in the recess and a granular additives contained in the sealing material, wherein the inner wall surface of the recess has a light blocking section that blocks light emitted by the light emitting device from illuminating the inner edge of the opening of the recess, the portion of the sealing material on the side of the bottom of the recess is formed as a first sealing layer that contains the granular additives, while thickness of the first sealing layer is in a range from 10% to 80% of the sealing material and the top surface of the first sealing layer is lower than the top end of the light blocking section.

In the second light emitting device of the present invention, the light blocking section prevents the light emitted by the light emitting device from reaching the inner edge of the opening, so that deterioration of the material in the inner edge of the opening is suppressed very effectively, similarly to the first light emitting device.

In addition, disposing the first sealing layer containing the granular additives on the bottom of the recess of the sealing material makes it possible to scatter the light emitted by the light emitting device so as to reduce direct illumination of inner wall surface of the recess of the housing by light from the light emitting device. Also, since the thickness of the first sealing layer is set in a range from 10% to 80% of the sealing material, the first sealing layer that contains the granular additives completely covers the light emitting element while being concentrated in the vicinity of the light emitting element, and therefore the effect of scattering the light emitted by the light emitting device is improved. Also, because the top surface of the first sealing layer is located lower than the top end of the light blocking section, the light emitted by the light emitting device, even when it is scattered by the granular additives, does not reach the inner edge of the opening and therefore the material forming the inner edge of the opening can be suppressed from degrading.

The phrase "thickness of the first sealing layer" is defined by assuming that the first sealing layer has a border at a position where concentration of the granular additives undergoes abrupt change in macroscopic observation of a central portion of the recess filled with the sealing material. Macroscopic observation may be conducted by observing dark field image under a metallurgical microscope.

Third, light emitting device of the present invention comprises a light emitting element having a pair of electrodes, a housing having a recess for accommodating the light emitting element, a first lead electrode and a second lead electrode which are exposed on the bottom of the recess, electrically conductive members for electrically connecting the pair of electrodes of the light emitting element to the first lead electrode and to the second lead electrode respectively, a transparent sealing material which fills in the recess and granular additives contained in the sealing material, wherein the inner wall surface of the recess has a light blocking section that blocks light emitted by the light emitting device from illuminating the inner edge of opening of the recess, maximum density of the granular additives having particle size of 2.0 µm or larger contained in the sealing material is set lower in the second region located above the light blocking section than in the first region located below the light blocking section, and the maximum density of the granular additives contained in the second region is not higher than 80% of the maximum density of the granular additives in the first region.

In the third light emitting device of the present invention, the light blocking section prevents the light emitted by the light emitting device from directly reaching the inner edge of the opening, so that deterioration of the material in the inner edge of the opening is suppressed very effectively, similarly to the first to the second light emitting device.

In the third light emitting device, maximum density of the granular additives having particle size of 2.0 µm or larger contained in the sealing material is set lower in the second region than in the first region, and the maximum density of the granular additives in the second region is set to 80% of the maximum density of the granular additives in the first region or less. This constitution makes it possible to enhance the scattering of light by the granular additives in the first region so as to reduce direct illumination of the inner wall surface of the recess of the housing by light from the light emitting device, and suppress scattering in the second region so as to suppress the illumination of the inner edge of the opening by the scattered light thereby suppressing the deterioration of the material of the inner edge of the opening.

The term density refers to the number of particles, observed within a predetermined area (e.g. a square of 30 μm) of a surface of the sealing resin revealed by cutting the light emitting device, divided by the area of the surface, given with a unit of number of particles per μm².

The maximum density is the highest value of density within the region under consideration. The granular particles may sediment toward the bottom before the sealing material hardens, depending on the particle size distribution and density of the granular particles and viscosity of the sealing member. Such a sedimentation results in such a distribution of the density of the granular additives and the density has the highest value in a portion where the granular particles have settled.

The constitution of the present invention described above makes it possible to provide the light emitting device which has high reliability and long service life, since the sealing resin can be suppressed from peeling off the inner edge of the opening and impurities can be fended off from entering the light emitting device.

DESCRIPTION OF REFERENCE NUMERALS

Figure 1A:
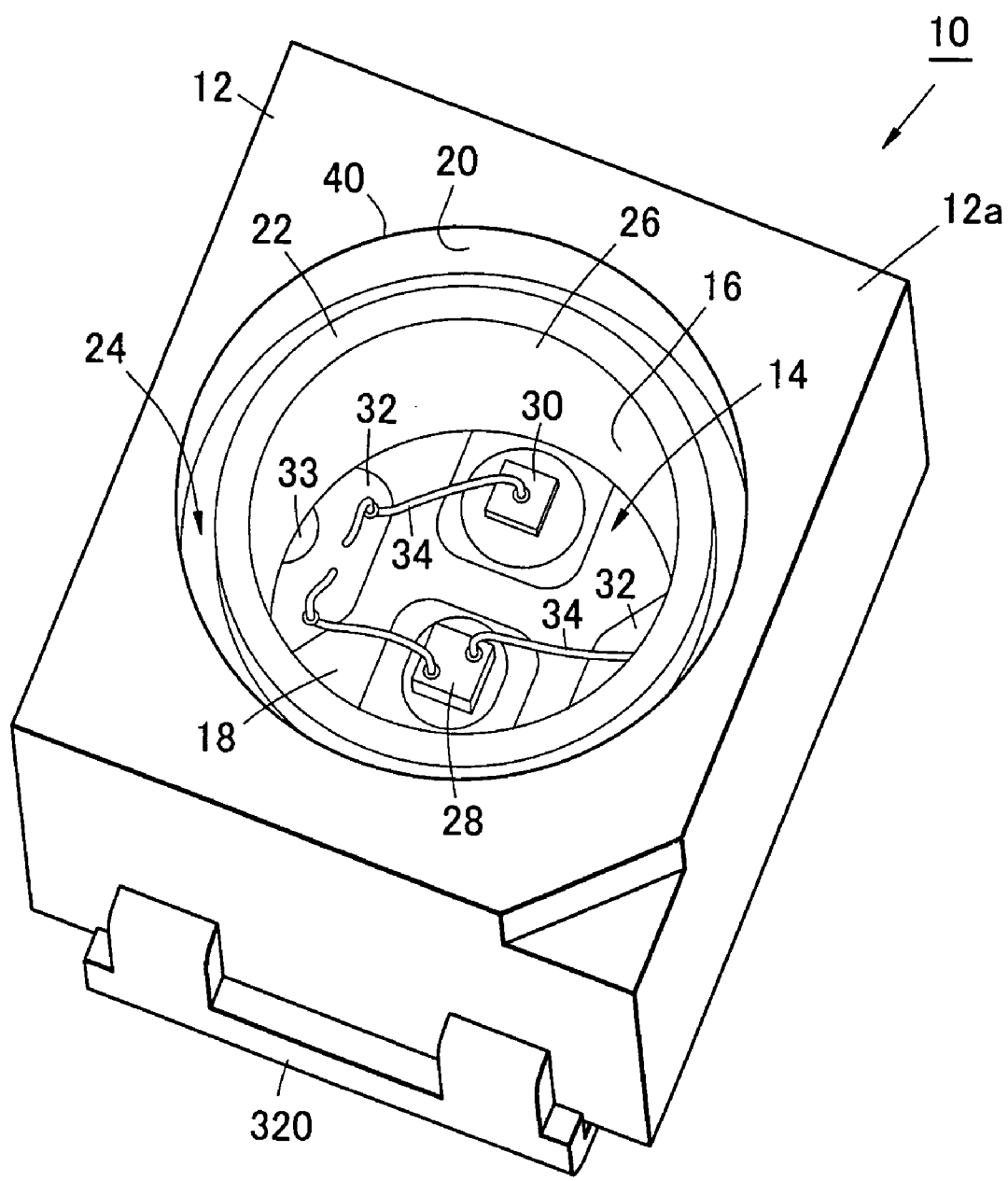
FIG. 1A is a perspective view schematically showing the light emitting device according to the first embodiment.

10: Light emitting device
12: Housing
12a: Light emitting surface
14: Recess
16: Inner wall surface of the recess
18: Bottom of the recess
20: Inner edge of the opening
22: Light blocking section
24: Trench
26: Transparent sealing material
261: First sealing layer
262: Second sealing layer
28: Light emitting element
30: Protective element
32: Lead electrode
320: External electrode
34: Electrically conductive wires
36: Protrusion
38: Opening
40: Edge of opening
42: Notch
$R_1$: First region
$R_2$: Second region
$T_1$: Thickness of first sealing layer
$T_2$: Thickness of second sealing layer

DESCRIPTION OF THE PREFERRED EMBODIMENTS

First Embodiment

Figure 1B:
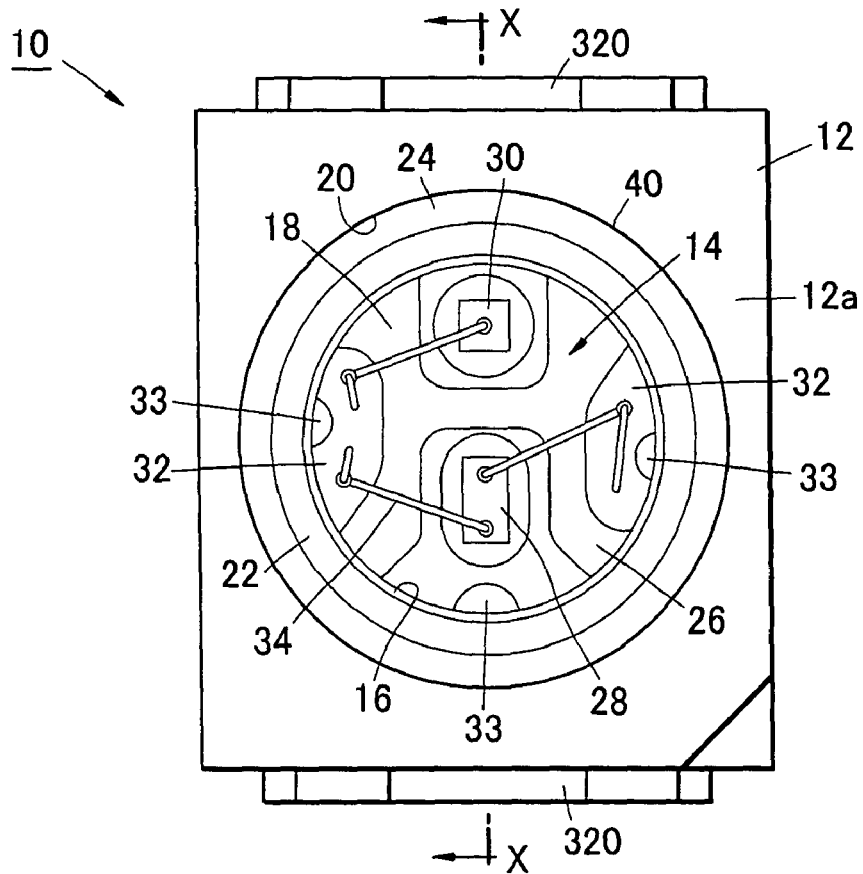
FIG. 1B is a top view schematically showing the light emitting device according to the first embodiment.
Figure 1C:
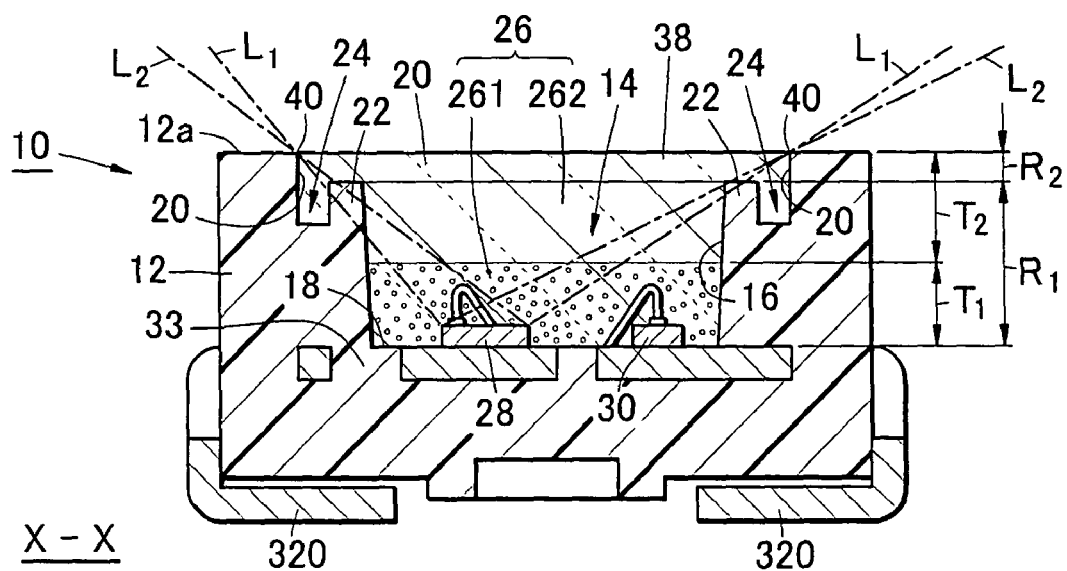
FIG. 1C is a schematic sectional view taken along lines X-X in FIG. 1B of the light emitting device according to the first embodiment.

A light emitting device 10 of this embodiment shown in FIG. 1A through 1C comprises a housing 12 having a recess 14 with circular opening 38 and cross section of inverted trapezoid shape, and a plurality of lead electrodes 32 which are exposed on the bottom 18 of the recess 14. Disposed over the lead electrodes 32 are light emitting element 28 and a protective element 30 die-bonded thereon for electrically protecting the light emitting element 28, and are electrically connected with the lead electrodes 32 by means of electrically conductive wires 34. The light emitting element 28 is wire-bonded by means of the electrically conductive wires 34 so as to be electrically connected to the lead electrodes 32 which are exposed on the bottom 18 of the recess 14. Since the lead electrodes 32 penetrate through the housing 12 and are connected to external electrodes 320, electrical power can be supplied to the light emitting element 28 by applying a voltage to the external electrodes 320.

Formed between the inner wall surface 16 of the recess 14 and the inner edge 20 of the opening is a continuous step having a ring shape when viewed from the front of the opening of the recess, the step being used as the light blocking section 22. As used herein, the term "inner edge 20 of the opening" means an inner wall surface 16 of the recess 14 in the vicinity of the opening 38, more specifically refers to the inner wall surface 16 in a range of up to 30% in depth of the recess 14 from the edge 40 of the opening 38 toward the bottom 18 of the recess 14. Depth of the recess 14 is the distance from the light emitting surface 12a to the bottom 18 of the recess 14, and is represented in FIG. 1C by the sum of thickness of the first region $R_1$ and thickness of the second region $R_2$.

The light blocking section 22 is formed so that the top thereof is lower than the light emitting surface 12a of the housing 12. The light blocking section 22 is disposed so that the inner edge of the opening located right below the edge 40 of the opening 38 would not be directly illuminated by the light from the light emitting element 28. Specifically, the light blocking section 22 is formed so as to surely block the light which would otherwise pass the line $L_1$-$L_2$ connecting both ends of the light emitting surface of the light emitting element 28 and the edge 40 of the opening 38. Such blocking of light will be called total blocking of light in this specification. With this constitution, the light from the light emitting device 28 is blocked by the light blocking section 22, and does not reach the inner edge 20 of the opening. Thus the problem of the light from the light emitting device 28 directly illuminating the inner edge 20 of the opening thereby to degrade the bond between the inner edge 20 of the opening and the sealing material 26 is solved by the light blocking section 22.

The light blocking section 22 shown in the drawing is formed with a height appropriate for total block of light incident on the inner edge 20 of the opening. Height of the light blocking section 22 is the distance between the bottom 18 of the recess 14 and the top of the light blocking section 22, and is the same as the thickness of the first region $R_1$.

The effect of suppressing the sealing resin 26 from peeling off the inner edge 20 of the opening can be achieved sufficiently also by partial blocking of light, instead of total blocking. With the constitution of the present invention, the light blocking section 22 having a height at least 80% of the height of the light blocking section 22 (which corresponds to thickness of the first region $R_1$) required for total blocking of light can achieve sufficient effect of suppressing the peeling. This is because impurities can be prevented from entering the light emitting device 28 even when there is a slight peeling gap between the edge 40 of the opening 38 and the sealing resin 26 as long as other portion in the region of the inner edge of the opening is prevented from peeling off, and therefore the object of the present invention to provide a light emitting device which has high reliability and long service life can be achieved. When height of the light blocking section 22 is less than 80% of the thickness of first region $R_1$, larger portion of the inner edge 20 of the opening is exposed to the direct light and may undergo peeling of the sealing resin 26 from the inner edge of the opening, thus increasing the possibility of infiltration by impurities.

The recess 14 is filled with the transparent sealing material to a height higher than the light blocking section 22. That is, the transparent sealing material 26 filling the recess has a height substantially equal to the light emitting surface 12a of the housing 12 which is located higher than the top of the light blocking section 22. The sealing resin 26 has the function of protecting the light emitting device 28 from the environment. The recess 14 of the housing 12 is divided into the first region $R_1$ located at a position lower than the top of the light blocking section 22 and the second region $R_2$ located at a position higher than the top of the light blocking section 22.

The sealing material 26 contains various granular additives mixed therein for the purpose of controlling the properties of the sealing material. The granular additives used in the present invention include fluorescent material particles which absorb the light emitted by the light emitting device 28 and emit light of a different wavelength, a powdery dispersant which diffuses the light from the light emitting device 28 and granular oxide for controlling the physical properties such as viscosity and thermal expansion coefficient. These materials may be used either individually or collectively.

The materials used as the granular additives have a property of scattering light. As a result, the granular additives contained in the first region $R_1$ in a large quantity would scatter the light directly incident from the light emitting device 28, so that the intensity of light that illuminates the inner wall surface 16 of the recess 14 is reduced. Thus, the effect of suppressing the degradation of the material due to absorption of light by the inner wall surface 16 can be achieved. In the meantime, when the granular additives are contained in the second region $R_2$ in a large quantity, it does not achieve the effect of suppressing the degradation of the material by scattering, since the inner edge 20 of the opening is shielded from direct light by the light blocking section 22. On the other hand, if the scattered light passes over the light blocking section 22 and reaches the inner edge 20 of the opening, the scattered light illuminates the region which is totally blocked by the light blocking section 22. Although, the intensity of scattered light is weak compared to the light coming directly from the light emitting device 28, degradation of inner edge 20 of the opening by the scattered light may not be negligible if a large part of the light is scattered.

This problem is addressed in the first light emitting device 10 of the present invention, by controlling the quantity of the granular additives contained in the sealing material 26 that fills the first region $R_1$ located below the light blocking section 22 to such a level that is sufficient to scatter the light. This makes it possible to scatter the light directly coming from the light emitting device 28, so as to reduce direct illumination of inner wall surface 16 of the recess 14 of the housing 12 by light from the light emitting device 28. Also, the quantity of the granular additives contained in the sealing material 26 that fills the second region $R_2$ located above the light blocking section 22 is controlled to such a level that does not substantially affect the scattering of light. As a result, light scattered by the sealing material 26 that fills the second region $R_2$ is suppressed from reaching the inner edge 20 of the opening.

In the second light emitting device 10 of the present invention, the sealing material 26 contains a first sealing layer 261 which is located on the bottom 18 of the recess 14 and contains the granular additives, with proportion $T_1/(T_1+T_2)$ of the thickness $T_1$ of the first sealing layer 261 to the thickness $T_1+T_2$ of the sealing material 26 being controlled in a range from 10% to 80%. When this proportion is less than 10%, the top surface of the light emitting device 28 may be exposed through the first sealing layer 261, and therefore the effect of scattering the light from the light emitting device 28 by the first sealing layer 261 cannot be obtained. When this proportion is more than 80%, density of the granular additives becomes lower in the vicinity of the light emitting device 28, thus resulting in lower scattering effect also in this case. In the second light emitting device 10, the first sealing layer that contains the granular additives completely covers the light emitting element 28 while being concentrated in the vicinity of the light emitting element 28, and therefore the effect of scattering the light emitted by the light emitting device 28 is improved. Also, because the top surface of the first sealing layer 261 is located lower than the top end of the light blocking section 22, the light emitted by the light emitting device 28, even when it is scattered by the granular additives, does not reach the inner edge of the opening.

In the third light emitting device 10 of the present invention, the maximum density of the granular additives having particle size 2.0 μm or larger contained in the sealing material 26 is set lower in the second region $R_2$ than in the first region $R_1$, and the maximum density of the granular additives in the second region $R_2$ is set not higher than 80% of the maximum density of the granular additives in the first region $R_1$. This constitution makes it possible to enhance the scattering of light by the granular additives in the first region $R_1$ so as to reduce direct illumination of inner wall surface 16 of the recess 14 of the housing 12 by the light from the light emitting device, and suppress scattering in the second region $R_2$ so as to suppress the illumination of the inner edge 20 of the opening by the scattered light.

As used herein, the term "particle size" is used in the sense of mean particle size, determined by the F.S.S.S. (Fischer sub-sieve sizer) method from the mean value of the sizes of primary particles derived from specific surface area measured by the air permeation method.

For the fluorescent material particles having particle sizes of 2.0 μm or larger which are contained in a large quantity and may have significant influence on scattering, in particular, the maximum density of the granular additives is preferably lower in the second region $R_2$ than in the first region $R_1$, specifically the maximum density of the granular additives in the second region $R_2$ is preferably not higher than 50% of the maximum density of the granular additives in the first region $R_1$. When this proportion is higher than 50%, significant influence of the scattered light may results which is not desirable.

Another light emitting device 10 according to the present invention may also be defined by the density of the granular additives contained in the sealing material 26 that fills the second region $R_2$. This density of the granular additives may be defined by the weight or the number of particles contained in unit volume, in order to reflect the influence on scattering. Alternatively, for the convenience of checking to see if proper level of density is achieved after manufacture, density of the granular additives may also be defined by the number of particles in unit area of a surface of the sealing resin revealed by cutting the light emitting device.

It is preferable to control the density of the fluorescent material particles which are contained in particularly large quantity among the granular particles and may have larger influence on scattering.

As shown in FIG. 1C, the light emitting device 10 of this embodiment has a structure of stacking the first sealing layer 261 and the second sealing layer 262. The first sealing layer 261 is formed from a transparent sealing material which contains granular additives, and is disposed on the side of bottom 18 of the recess 14 (in the vicinity of the light emitting device 28). The second sealing layer 262 is formed from a sealing material which does not include granular additives or contains granular additives of a quantity less than the predetermined quantity, and is disposed above the first sealing layer 261 (namely on the side of the light emitting surface 12*a*).

Since the sealing material 26 having such a stacked structure is formed by filling the first sealing layer 261 and then forming the second sealing layer 262, the first sealing layer 261 and the second sealing layer 262 are separated by a clear borderline. Therefore, even when the granular additives are contained in a high density in the first sealing layer 261, the granular additives do not infiltrate into the second sealing layer 262, so that density of the granular additives in the second sealing layer 262 can be precisely controlled.

There is such a sealing material 26 of other than the stacked type described above, that is formed by single operation of applying the resin. Specifically, the first sealing layer 261 and the second sealing layer 262 are formed by potting a liquid sealing material, containing granular additives mixed therein, into the recess 14 and is left to stand still so that the granular additives sediment from the opening 38 of the recess 14 toward the bottom 18 before the sealing material hardens.

The sealing material formed by single operation of applying the resin can be manufactured more easily with a fewer number of processes, compared to the case of forming by applying the resin in two steps. In the meantime, it has such a drawback that the border between the first sealing layer 261 and the second sealing layer 262 cannot be precisely determined. This problem is particularly significant when defining the thickness of the first sealing layer 261. For this reason, border of the first sealing layer is defined as follows according to the present invention.

While the granular additives mixed in the sealing material 26 generally sediment evenly downward after potting, the granular additives may be hampered from sedimenting by the friction between the wall surface 16 and the sealing resin 26 in the region adjacent to the inner wall surface 16. As a result, the granular additives that have not sedimented may be retained in the vicinity of the wall surface. However, density of the granular additives positioned in the vicinity of the wall surface is low and is considered to have less influence on scattering. Accordingly in the present invention, discussion will be focused on the portion of the granular additives which have properly sedimented, and the border of the first sealing layer in this present invention refers to the portion located farthest from the inner wall surface 16 which is considered to be less affected by the friction, namely the border of the first sealing layer 261 in the area around the center of the recess 14. In case the light emitting element 28 is disposed near the center of the recess 14, the first sealing layer 261 may locally bulge along the light emitting element 28. In such a case, distance between the bottom of the recess and the top of the bulging portion of the first sealing layer 261 will be taken as the thickness of the first sealing layer 261.

In this embodiment, a trench 24 is formed between the inner edge 20 of the opening and the light blocking section 22. Since the trench 24 increases the surface area in the portion between the inner edge 20 of the opening and the light blocking section 22, contact area between the sealing material 26 and the housing 12 can be increased. As a result, there is also such an effect that it is made easier to hold the sealing material 26 in the recess 14 of the housing 12 and prevent the sealing material 26 from falling off.

The light blocking section 22 may have various cross sections such as rectangle as shown in FIG. 1C and peaked shape.

Whatever a shape the light blocking section 22 may have, the contact area with the sealing material 26 can be increased and therefore the light emitting device having high reliability in which the sealing material 26 is less likely to peel off can be made.

Some of the lead electrodes 32 of this embodiment have through holes 33 formed in the direction of thickness thereof (for example, the lead electrodes 32 on the right, left and lower sides among the lead electrodes 32 which are exposed on the bottom surface of the recess of the housing 12 shown in FIG. 1B). The bottom 18 of the housing 12 is exposed in the through hole 33. Formation of the through holes 33 in the lead electrodes 32 results in a decreased area of the sealing resin 26 making contact with the lead electrode 32 and an increased area making contact with the housing when the recess 14 is filled with the sealing resin 26. Since bonding between the sealing material 26 and the housing 12 is stronger than the bond between the sealing resin 26 and the lead electrode 32, the bond between the sealing material 26 and the housing 12 can be made stronger.

Such a design as the bond between the sealing material 26 and the housing is positioned around the light emitting element 28 enables it to suppress the light emitting element 28 from coming off the lead electrodes 32. FIG. 1B shows such a situation that the lead electrode 32 whereon the light emitting element 28 is secured is surrounded by the space between the lead electrodes (where the housing material is exposed) on three sides (right, left and top) while the through hole 33 is formed on the bottom. Exposing the housing material in this way enables it to make the light emitting element 28 less likely to come off the lead electrodes 32.

The bond between the sealing material 26 and the housing may be located also around the position where the electrically conductive wires 34 is bonded, in addition to the area around light emitting element 28. When the through hole 33 is formed in the vicinity of the position where the electrically conductive wires 34 is bonded, the electrically conductive wires 34 become less likely to come off the lead electrode 32.

First Variation

Figure 2A:
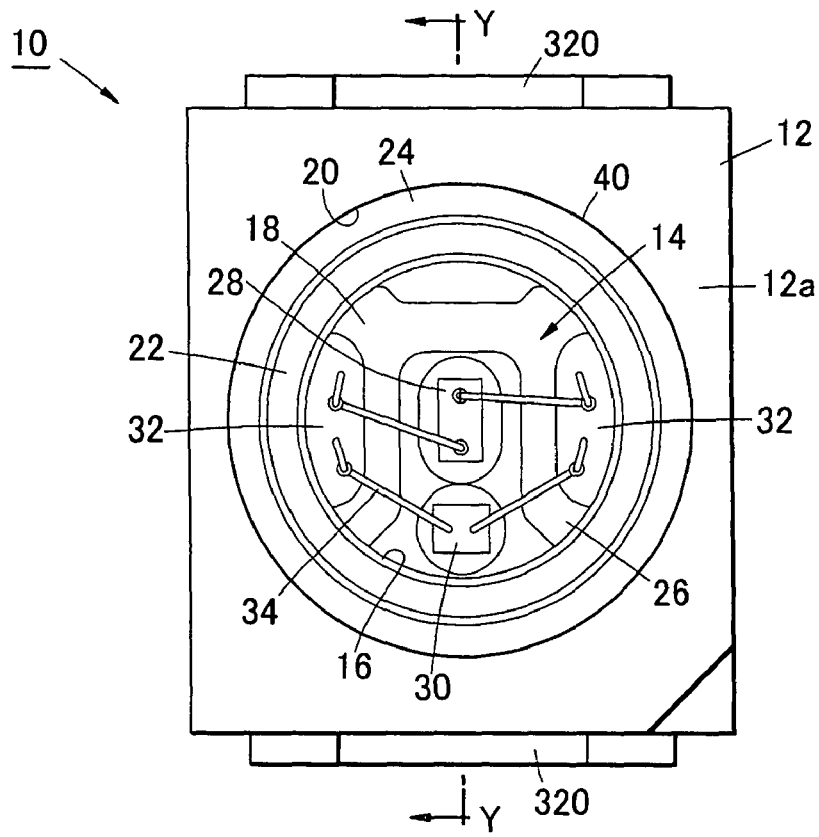
FIG. 2A is a top view schematically showing the light emitting device according to the first variation of the first embodiment.
Figure 2B:
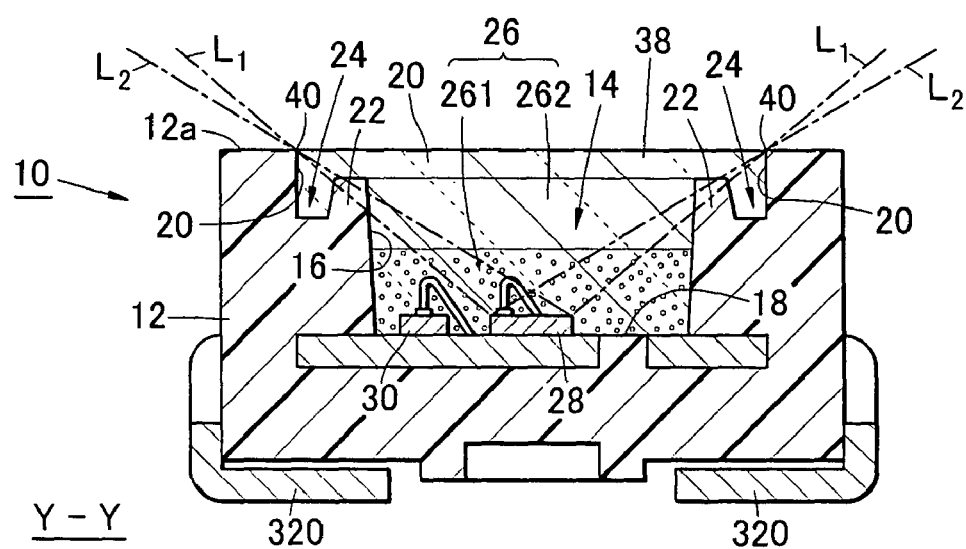
FIG. 2B is a schematic sectional view taken along lines Y-Y in FIG. 2A of the light emitting device according to the first variation of the first embodiment.

FIG. 2A and FIG. 2B show a first variation of this embodiment, where the lead electrodes 32 have different shape, while the light emitting device 28 and the protective element 30 are mounted differently. With one of the lead electrodes 32 formed to be longer and the light emitting device 28 and the protective element 30 being mounted on the same lead electrode 32, it is made possible to mount the light emitting element 28 at the center of the recess 14 of the housing 12, thereby making the light emitting device 10 emit light in an isotropic pattern.

In case the lead electrodes 32 whereon the light emitting device 28 and the protective element 30 are mounted are changed, polarity of the electrodes of each element and the polarity of the electrode must be taken into consideration. When polarity of the electrodes of each element and the polarity of the electrode are taken into consideration, mounting of the light emitting device 28 and the protective element 30 can be changed to various forms.

Second Variation

Figure 3A:
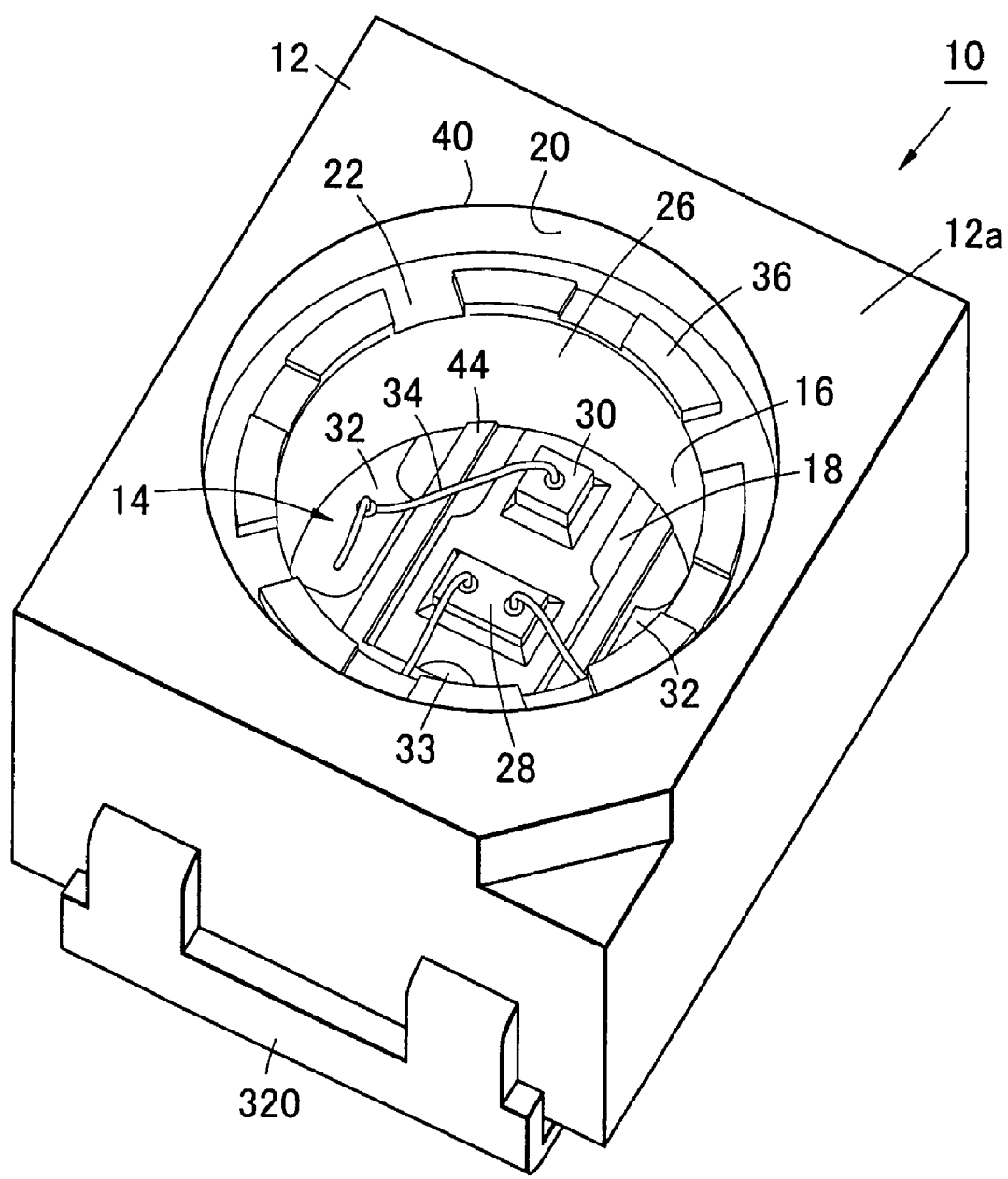
FIG. 3A is a perspective view schematically showing the light emitting device according to the second variation of the first embodiment.
Figure 3B:
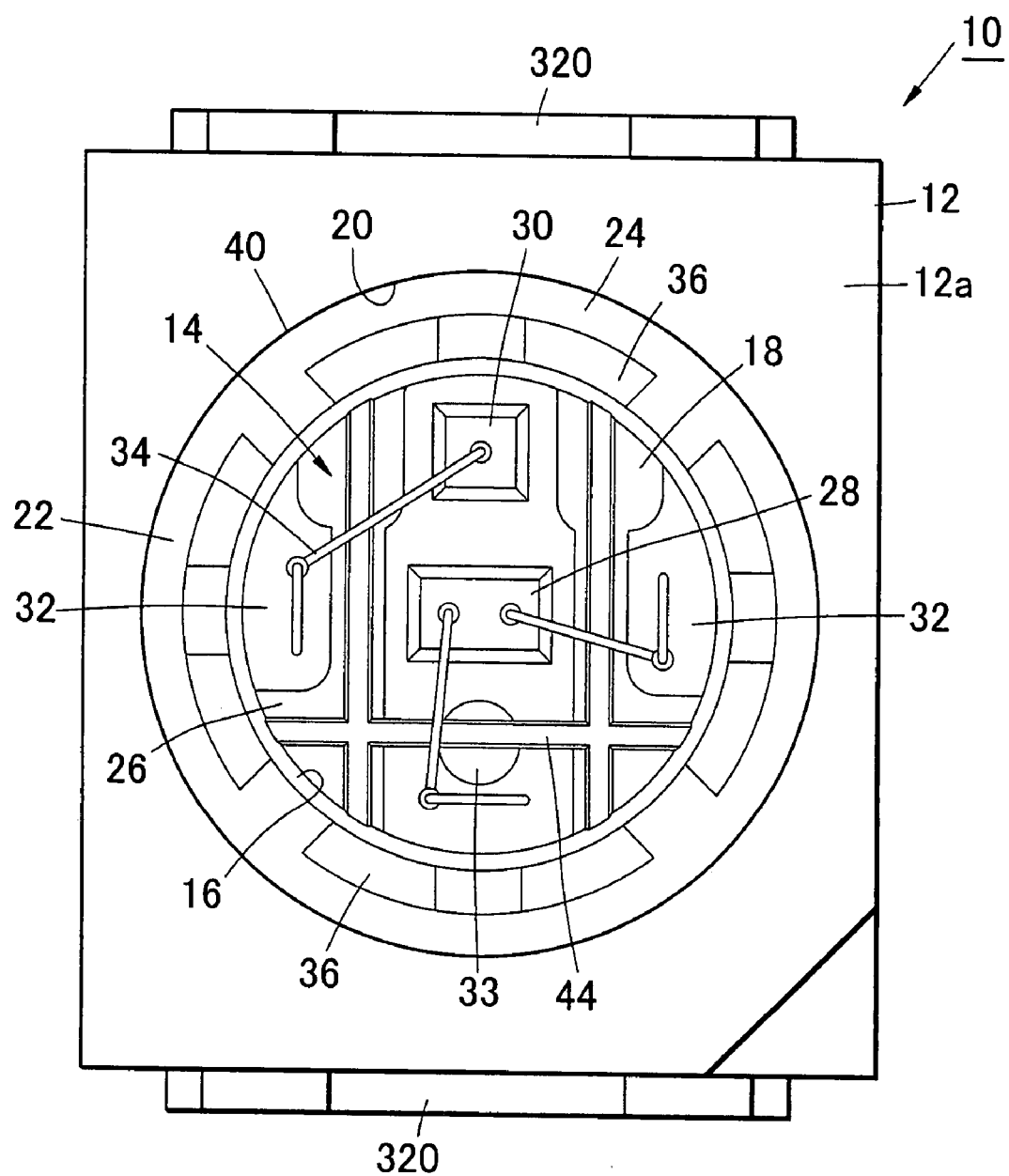
FIG. 3B is a top view schematically sowing the light emitting device according to the second variation of the first embodiment.

FIG. 3A and FIG. 3B show a second variation of this embodiment, where a plurality (four in this example) of protrusions 36 are formed with a space from each other on top of the light blocking section 22, instead of forming the trench 24 around the light blocking section 22. The protrusions 36 each have a shallow groove (higher than the light blocking section 22) formed at the center thereof in the circumferential direction. Since such protrusions increase the surface area as the trench 24 does, the area of contact between the sealing material 26 and the inner surface of the recess 14 of the housing 12 becomes larger. As a result, there is also such an effect that it is made easier to hold the sealing material 26 in the recess 14 of the housing 12 and prevent the sealing material 26 from falling off.

In addition, when the sealing material 26 is applied, the sealing material 26 potted into the recess 14 passes through the space between the protrusions 36 and reaches the periphery of the protrusion 36, so that air is less likely to be trapped. As a result, there is less possibility of defective light emitting device 10 having bubbles trapped in the sealing material 26 being manufactured.

In the second variation, a grid 44 (a grating of ridges) formed between the lead frames on the bottom 18 of the recess 14, so as to prevent the adhesive used in die bonding of the light emitting device 28 and the protective element 30 from spreading to the position of wire bonding of the electrically conductive wires 34. The grid 44 is preferably formed integrally with the housing 12.

The grid 44 may also be formed so as to traverse the surface of the lead electrode 32. In case such a material is used that the bonding between the grid 44 and the surface of the lead electrodes 32 becomes weak, the grid 44 can easily come off the lead electrode 32. The grid 44 can be prevented from coming off by joining a part of the grid 44 to the bottom 18 of the recess 14 and/or the inner wall surface 16 of the housing 12. The bonding strength can also be increased by putting the grid 44 and the lead electrodes 32 into contact with each other over a larger area. Methods of preventing the grid 44 from coming off will be exemplified below. These methods may be applied either individually or collectively in combination.

(1) The through hole 33 is formed in the lead frame 32 at the position where the grid 44 is formed. The grid 44 and the bottom 18 of the housing 12 are joined with each other via the through hole 33. As a result, the grid 44 is firmly secured onto the bottom 18, and accordingly the lead electrodes 32 are also secured onto the bottom 18.

(2) The grid 44 is extended to the inner wall surface 16 of the recess 14 and the ends of the grid 44 are joined with the inner wall surface 16. Since the grid 44 formed over a longer stretch is more likely to be lifted, it is preferable to form the grid 44 at a position other than a position where the distance between two portions of the inner wall surface 16 where both ends of the grid 44 are joined becomes largest (for example, the position corresponding to the diameter of the recess 14 in case the recess 14 has circular top surface).

(3) A groove is formed in the lead electrode 32 at positions where the grid 44 is to be formed. The groove increases the contact area between the grid 44 and the lead electrode 32, thereby making the grid 44 less likely to come off.

Component members of the light emitting device 10 of the present invention will be described in detail.

(Sealing Material 26)

The recess of the housing is filled with the transparent sealing material, so as to protect the light emitting element, the protective element and the electrically conductive wires from the environment.

The transparent sealing materials preferably used as the sealing material 26 include epoxy resin, silicone resin, urea resin, fluorocarbon resin, a mixture of some of these resins, and an inorganic material such as glass. Silicone resin, which is better in translucency and heat resistance, is particularly suitably used as the sealing material. Bonding between the silicone resin and the housing 12 can be increased by providing the light blocking section 22 and restricting the density of the granular additives in the second region $R_2$ as in the light emitting device 10 of the present invention, thereby to suppress the silicone resin from peeling off the inner edge 20 of the opening. Thus, the light emitting device 10 of the present invention achieves higher efficiency of extracting light and longer service life than in the prior art, by using the silicone resin for the sealing material 26.

(Granular Additives)

For the granular additives used in the light emitting device 10 of the present invention, a powdery fluorescent material, a powdery dispersant and/or granular oxide may be used.

For the fluorescent material particles, the following fluorescent materials may be used.

The fluorescent material is required only to be capable of absorbing light emitted by the light emitting element and transforming it into light of a different wavelength. For example, the fluorescent material is preferably at least one kind selected from nitride-based fluorescent material, oxide-nitride-based fluorescent material or sialon-based fluorescent material activated mainly with lanthanoid element such as Eu or Ce, alkaline earth element halogen apatite fluorescent material, alkaline earth metal element boride halogen fluorescent material, alkaline earth metal element aluminate fluorescent material, alkaline earth element silicate fluorescent material, alkaline earth element sulfide fluorescent material, alkaline earth element thiogalate fluorescent material, alkaline earth element silicon nitride fluorescent material or germanate fluorescent material activated mainly with lanthanoid element such as Eu or transition metal element such as Mn, rare earth aluminate fluorescent material or rare earth silicate fluorescent material activated mainly with lanthanoid element such as Ce, and organic compound or organic complex activated mainly with lanthanoid element such as Eu. Specifically, the fluorescent materials cited below may be used, but the present invention is not limited to these materials.

The nitride-based fluorescent materials activated mainly with lanthanoid element such as Eu, Ce or the like include $M_2Si_5N_8$: Eu or $CaAlSiN_3$: Eu (M is at least one element selected from among Sr, Ca, Ba, Mg and Zn). In addition to $M_2Si_5N_8$: Eu, $MSi_7N_{10}$: Eu, $M_{1.8}Si_5O_{0.2}N_8$: Eu and $M_{0.9}Si_7O_{0.1}N_{10}$: Eu (M is at least one element selected from among Sr, Ca, Ba, Mg and Zn) are also contained.

The oxide-nitride-based fluorescent materials activated mainly with lanthanoid element such as Eu or Ce include $MSi_2O_2N_2$: Eu (M is at least one element selected from among Sr, Ca, Ba, Mg and Zn).

The sialon-based fluorescent materials activated mainly with lanthanoid element such as Eu or Ce include $M_{p/2}Si_{12-p-q}Al_{p+q}O_qN_{16-p}$: Ce, M-Al—Si—O—N (M is at least one element selected from among Sr, Ca, Ba, Mg and Zn, while q has a value from 0 to 2.5 and p has a value from 1.5 to 3).

The alkaline earth element halogen apatite fluorescent materials activated mainly with lanthanoid element such as Eu or transition metal element such as Mn include $M_5(PO_4)_3X$: R (M is at least one element selected from among Sr, Ca, Ba, Mg and Zn, X is at least one element selected from among F, Cl, Br and I, and R is at least one element selected from among Eu, Mn and a combination of Eu and Mn).

The alkaline earth metal element boride halogen fluorescent materials include $M_2B_5O_9X$: R (M is at least one element selected from among Sr, Ca, Ba, Mg and Zn, X is at least one element selected from among F, Cl, Br and I, and R is at least one element selected from among Eu, Mn and a combination of Eu and Mn).

The alkaline earth metal element aluminate fluorescent materials include $SrAl_2O_4$: R, $Sr_4Al_{14}O_{25}$: R, $CaAl_2O_4$: R, $BaMg_2Al_{16}O_{27}$: R, $BaMg_2Al_{16}O_{12}$: R and $BaMgAl_{10}O_{17}$: R (R is at least one element selected from among Eu, Mn and a combination of Eu and Mn).

The alkaline earth metal sulfide-based fluorescent materials include $La_2O_2S$: Eu, $Y_2O_2S$: Eu, and $Gd_2O_2S$: Eu.

The rare earth metal aluminate-based fluorescent materials activated mainly with lanthanoid element such as Ce include YAG fluorescent materials having compositions of $Y_3Al_5O_{12}$: Ce, $(Y_{0.8}Gd_{0.2})_3Al_5O_{12}$: Ce, $Y_3(Al_{0.8}Gd_{0.2})_5O_{12}$: Ce and $(Y, Gd)_3(Al, Ga)_5O_{12}$. There are also $Tb_3Al_5O_{12}$: Ce and $Lu_3Al_5O_{12}$: Ce where a part or the whole of Y is replaced with Tb, Lu or the like.

Other fluorescent materials include ZnS: Eu, $Zn_2GeO_4$: Mn and $MGa_2S_4$: Eu (M is at least one element selected from among Sr, Ca, Ba, Mg and Zn, and X is at least one element selected from among F, Cl, Br and I).

The fluorescent materials described above may include at least one element selected from among Tb, Cu, Ag, Au, Cr, Nd, Dy, Co, Ni and Ti instead of, or in addition to Eu as required.

Fluorescent materials other than those described above may also be used as long as similar performance and effects can be provided.

In addition to fluorescent materials which are excited by light from the light emitting element and emit light with a spectrum including yellow, red, green and/or blue light, fluorescent materials which emit light with a spectrum including intermediate colors such as yellow, blue green or orange light may also be used. Using these fluorescent materials in various combinations makes it possible to manufacture surface-mounted light emitting device which emit light of different colors.

For example, a GaN-based compound semiconductor which emits blue light may be used to excite a fluorescent material such as $Y_3Al_5O_{12}$: Ce or $(Y_{0.8}Gd_{0.2})_3Al_5O_{12}$: Ce so as to emit light of different wavelength. Thus, a light emitting device which emits white light can be provided by blending the light from the light emitting element and the light emitted by the fluorescent material.

For example, fluorescent material $CaSi_2O_2N_2$: Eu or $SrSi_2O_2N_2$: Eu which emits light in a range from green to yellow, fluorescent material $(Sr, Ca)_5(PO_4)_3Cl$: Eu which emits blue light and fluorescent material $Ca_2Si_2N_8$: Eu or $CaAlSiN_3$: Eu which emits red light may be used so as to provide a light emitting device which emits white light with better color rendering performance. This constitution uses the three primary colors of red, blue and green, and is therefore capable of emitting a desired white light only by changing the proportions of the first fluorescent material and the second fluorescent material.

In the light emitting device 10 which emits whitish light, in particular, a fluorescent material which absorbs blue light and emits yellow light may be used in combination with the light emitting element 28 which emits blue light, such as aluminum oxide-based fluorescent material (YAG: Ce) that contains aluminum as ingredient and is activated with a rare earth element such as cerium. Now, a method of forming a yttrium aluminum garnet-based fluorescent material which is a kind of aluminum oxide-based fluorescent material will be described. First, rare earth element such as solution of a mixture of rare earth elements Y, Gd, Ce, La, Al, Sm, Pr, Tb in stoichiometrical proportions dissolved in an acid is coprecipitated with oxalic acid, of which product is fired to obtain a coprecipitated oxide which is mixed with aluminum oxide to obtain a stock material mixture. This mixture, with a fluoride such as ammonium fluoride added thereto as a flux, is put into a crucible and fired at a temperature from 1,400° C. in air for three hours. The fired mixture is crushed in a ball mill in water, and undergoes the processes of washing, separation, drying and sieving. Thus, a fluorescent material having composition of $Gd_{0.6}Ce_{0.03}Y_{2.4}Al_5O_{12}$ is made.

For the dispersant, silica, alumina, titanium dioxide or the like is preferably used, and is capable of causing the light emitting device 10 to emit light in an isotropic pattern by scattering light from the light emitting element 28.

For the granular oxide in this embodiment, silica, alumina and glass are appropriate. These oxides have the effect of decreasing the linear expansion coefficient of the sealing material 26 so as to mitigate the thermal stress acting on the sealing material 26, and improving the mechanical strength of the sealing material 26. As a result, the sealing material 26 becomes more durable against cracks, thereby elongating the service life of the light emitting device.

(Housing 12)

The housing 12 may be formed from a liquid crystal polymer, a polyphthalamide resin, polybutylene terephthalate (PBT) or the other thermoplastic resin. A semi-crystalline polymer resin which contains a crystal having high melting point such as polyphthalamide resin is particularly preferable since it has a high surface energy and can firmly bond with the sealing resin which fills the recess 14 of the housing 12. This makes peel-off less likely to occur in the interface between the housing and the sealing resin when the resin is cooled in the process of applying and hardening the sealing resin.

The inner wall surface 16 of the recess 14 of the housing 12 serves also as a reflector which reflects the light from the light emitting element 28, and therefore it is preferable to adjust the angle of the inner wall surface 16 with respect to the bottom 18 of the recess 14, so as to increase the light emitting efficiency of the light emitting device 10. In case the light emitting device 10 employs a semiconductor light emitting element as the light emitting element 28, reflectivity of the inner wall surface 16 can be increased by mixing a white pigment such as titanium oxide in the material used to mold the housing 12, thereby improving the reflecting effect.

(Light Emitting Element 28)

For the light emitting element 28, a semiconductor light emitting element is preferably used. To manufacture the light emitting device 10 which emits whitish light, for example, a light emitting element 28 which emits blue light using a nitride semiconductor may be used. As described above, the light emitting device 10 which emits white light can be made by combining a fluorescent material which emits yellow light with the light emitting element 28.

The nitride semiconductor light emitting element 28 using an insulating substrate such as sapphire is electrically connected to the lead electrodes 32 by wire bonding with the electrically conductive wires 34.

(Protective Element 30)

The protective element 30 is an element such as zener diode that is connected in parallel to the light emitting element so as to electrically protect the light emitting element. The light emitting element such as a light emitting diode has a low electrostatic withstanding voltage, and is susceptible to electrostatic breakdown when subjected to a high voltage such as reverse surge. Connecting the protective element 30 prevents destruction of the light emitting element 28 by causing a reverse current to flow in the protective element 30.

The protective element 30 and the lead electrodes 32 are electrically connected by wire bonding with the electrically conductive wires 34 on the front surface (positive electrode) while bonding the back surface (negative electrode) with an electrically conductive paste such as silver paste.

(Lead Electrode 32/External Electrode 320)

The lead electrode 32 and the external electrode 320 are all formed from the same electrically conductive material. For the purpose of ensuring the ease of machining and the strength, such materials are preferably used as iron, copper, copper-clad iron, copper-clad tin, and aluminum, iron or copper plated with copper, gold or silver.

(Electrically Conductive Wire 34)

For the electrically conductive wire 34 used in wire bonding, for example, metal wire such as gold, copper, platinum, aluminum or an alloy thereof may be used. The electrically conductive wire 34 is connected at one end thereof to an electrode of the element (light emitting element 28 or protective element 30) and is connected at the other end thereof to the lead electrode 32. Connection of the other end is preferably made by bonding a plurality of times while displacing the position to the same lead electrode 32. In the light emitting device 10 shown in FIG. 1A, for example, the other end of the electrically conductive wire 34 connected to the lead electrode 32 is bonded twice on the lead electrode 32. Bonding a plurality of times makes peel off less likely to occur between the electrically conductive wires 34 and the lead electrode 32, so that lighting failure of the light emitting device 10 due to defective electrical connection between the electrically conductive wires 34 and the lead electrode 32 is less likely to occur.

According to the present invention, light directly incident from the light emitting element 28 is blocked by the light blocking section 22 and scattered light is suppressed from passing over the light blocking section 22, so as to suppress the sealing resin 26 from peeling off the inner edge 20 of the opening more effectively than in the prior art. As a result, the light emitting device 10 having longer service life and higher reliability can be obtained. The present invention also makes it possible to preferably use silicone resin, which has been a cause of reducing the service life in the prior art, as the sealing resin 26.

Second Embodiment

Figure 4:
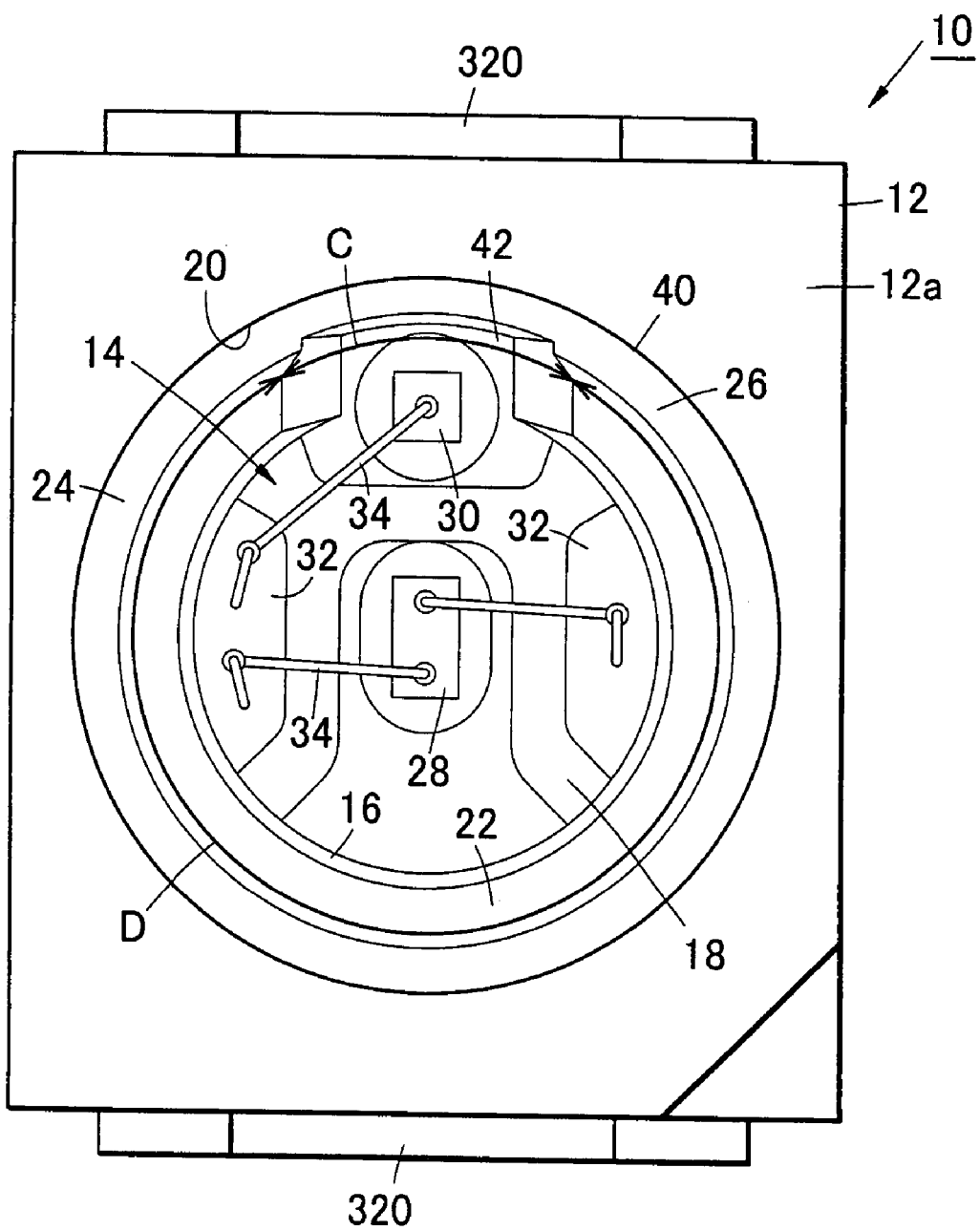
FIG. 4 is a top view schematically showing the light emitting device according to the second embodiment.
Figure 5:
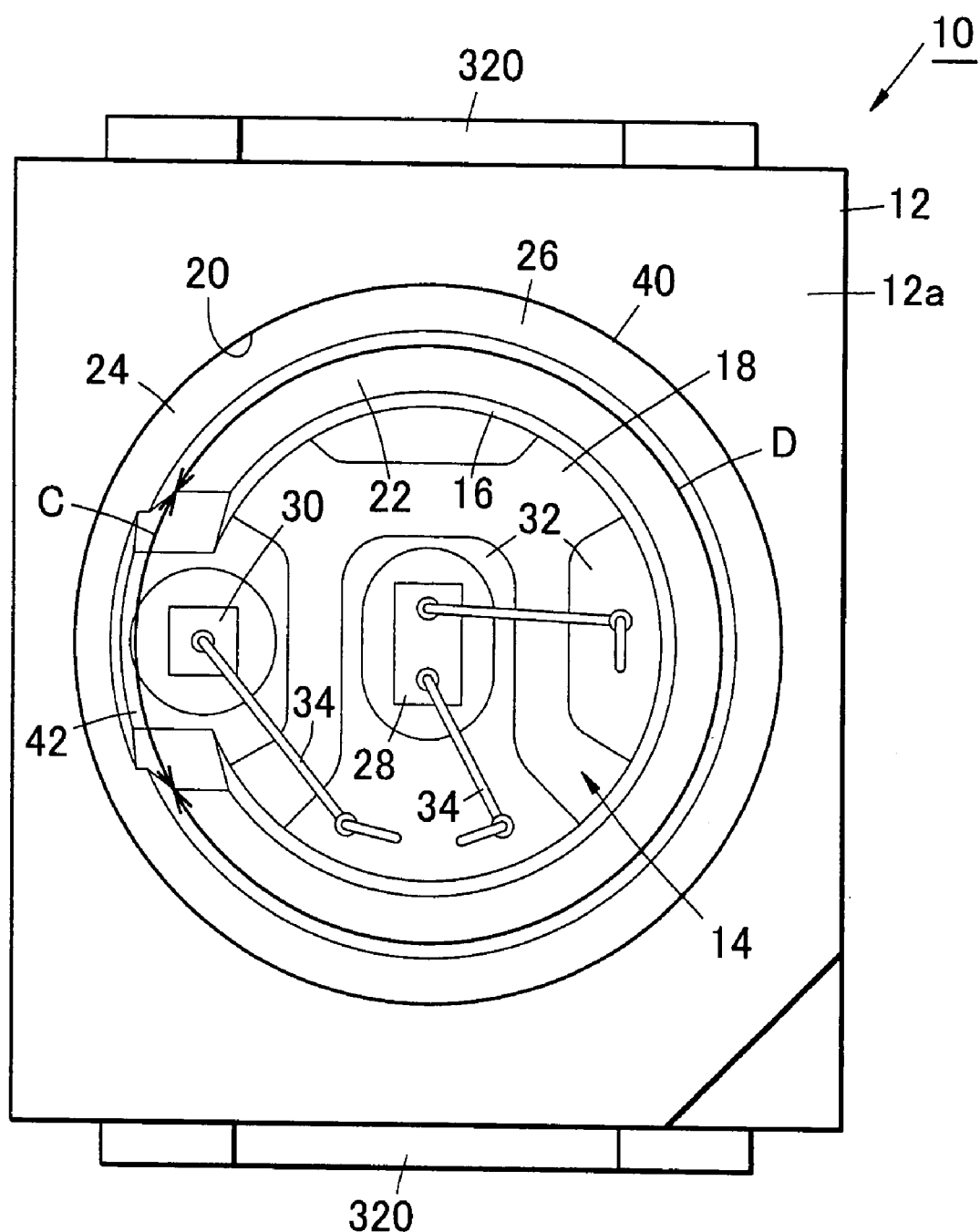
FIG. 5 is a top view schematically showing the light emitting device according to the second embodiment.

Second embodiment shown in FIG. 4 and FIG. 5 is the light emitting device 10 where a notch 42 is formed in a part of the recess 14 of the housing 12, so as to increase the area of the lead electrode 32 which is exposed. The protective element 30 is die-bonded onto the lead electrode 32 which is exposed through the notch 42. The light emitting device 10 of this embodiment is similar to that of the first embodiment, except for the notch 42 and the position of mounting the protective element 30.

When the notch 42 is formed as in this embodiment, a part of the light blocking section 22 is removed. As a result, the inner edge 20 of the opening of the recess 14 of the housing 12 is illuminated by the light incident directly from the light emitting element 28 via the notch 42.

However, providing the notch 42 makes it easier to mount the protective element 30 in the light emitting device which is made compact. Even when the space for mounting the semiconductor element is restricted at the center of the bottom of the recess by making the light emitting device compact, the light emitting element 28 can be mounted at the center of the recess 14 by disposing the semiconductor element other than the light emitting element and the wire for connecting the protective element within the notch 42. The notch 42 is formed with a minimum necessary size which corresponds to the size of the semiconductor element to be mounted therein. Therefore, since the quantity of the sealing resin 26 that fills therein is relatively small, there is a smaller difference in the expansion between the sealing material 26 and the inner edge 20 of the opening of the recess 14, and peel-off is less likely to occur between the sealing material 26 and the inner edge 20 of the opening. Also, because the quantity of the sealing resin 26 that fills therein can be decreased, there occurs less thermal stress acting on the light emitting element 28 and the electrically conductive wires 34, and such an effect can be expected as reliability of the light emitting element 28 is improved.

Providing the notch 42 in the recess 14 of the housing, as described above, has the drawback that the inner edge 20 of the opening is directly illuminated by the light emitted by the light emitting element 28 while providing the effect of improving the position of mounting the light emitting element 28, the effect of suppressing the sealing resin 26 from peeling off the inner edge 20 of the opening, and the effect of improving the reliability of light from the light emitting device 10. Therefore, it is desirable to take tradeoff of the drawback and advantages into account when forming the notch 42.

Proportion of well-balanced notch 42 is appropriately determined in accordance to the length of the light blocking section 22 along the periphery thereof. This is because the notch 42 is formed by cutting off a part of the light blocking section 22 substantially in parallel so that it is easier to mount the protective element 30, and the proportion of the inner edge of the opening which is exposed to the direct light that has passed through the notch 42 depends on the periphery of the light blocking section 22.

When measured along the periphery of the light blocking section 22, it is preferable to control the length C of the notch 42 and the length D of the remaining light blocking section 22 so that C/(C+D), the ratio of the length C of the notch 42 to the length C+D of the light blocking section 22 before forming the notch 42 is 50% or less, when forming the notch 42. When the proportion of the notch 42 is less than 50%, the problem of peel-off due to failure of blocking light becomes significant.

Since the light blocking section 22 is not formed in the notch 42, when the sealing material 26 is applied, the sealing material 26 potted into the recess 14 passes through the notch 42 and flows into the groove 24, so that air is less likely to be trapped. As a result, there is less possibility of defective light emitting device 10 having bubbles trapped in the sealing material 26.

First Variation

Figure 6:
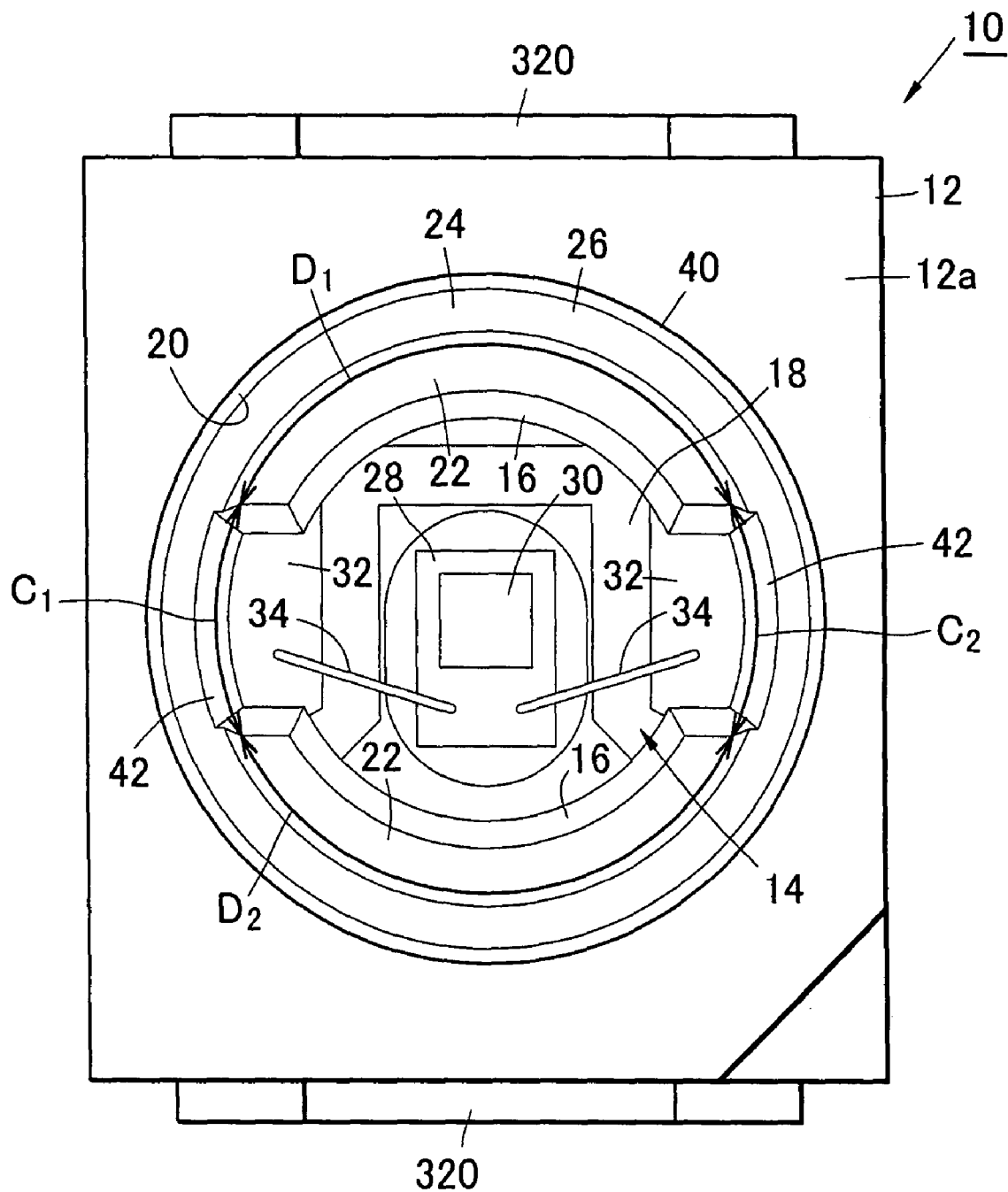
FIG. 6 is a top view schematically showing the light emitting device according to the first variation of the second embodiment.
Figure 7A:
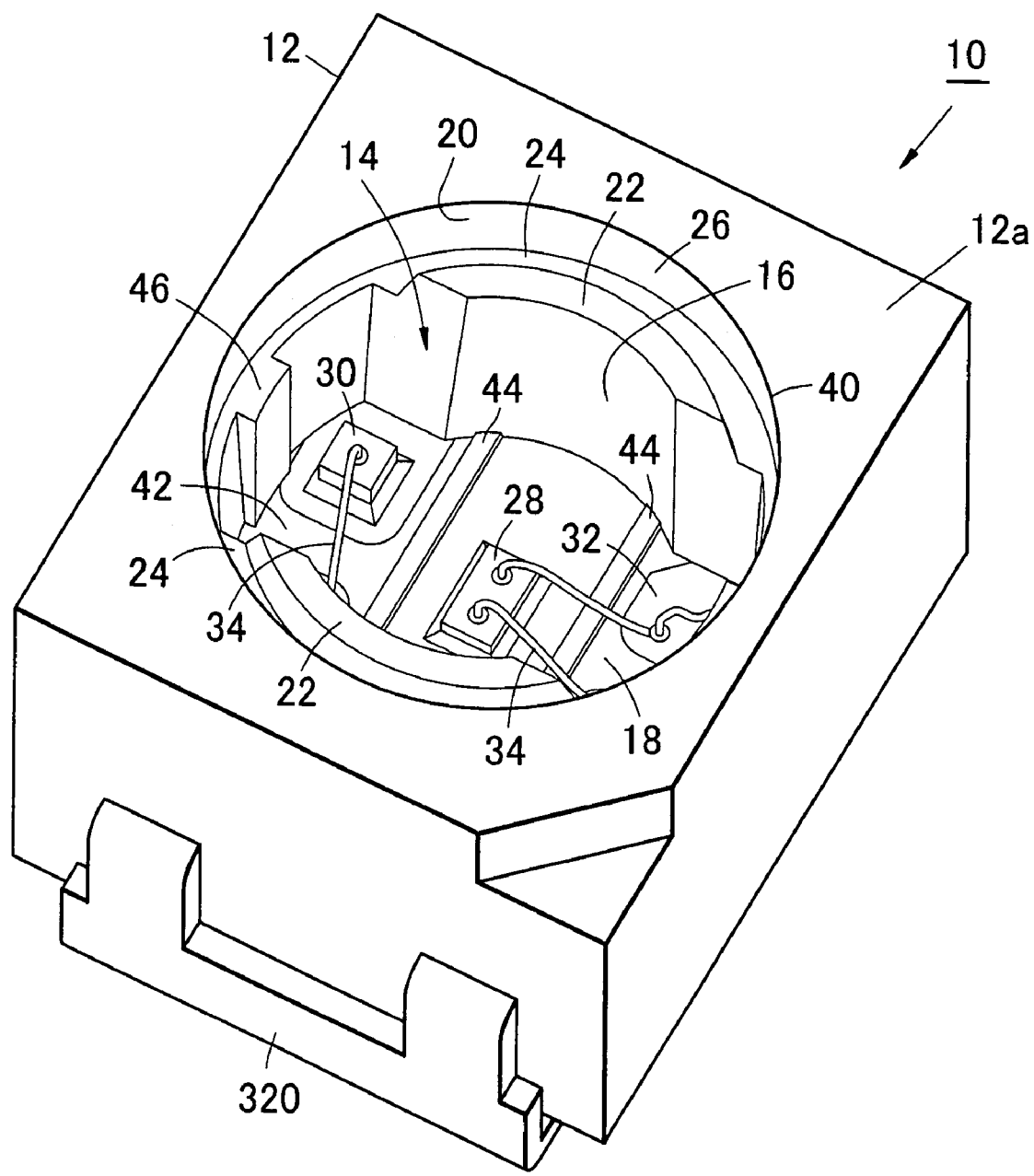
FIG. 7A is a perspective view schematically showing the light emitting device according to the first variation of the second embodiment.
Figure 7B:
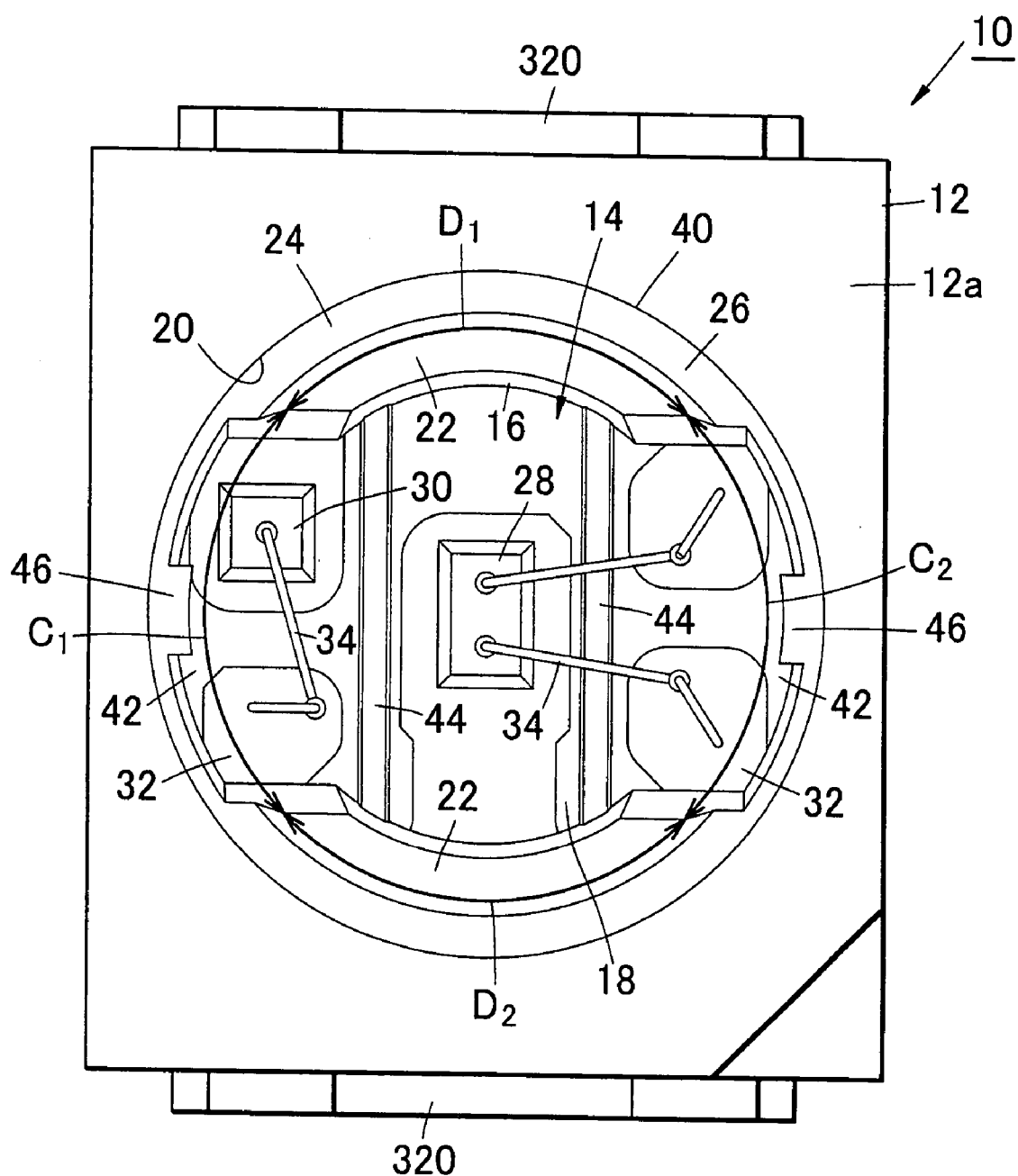
FIG. 7B is a top view schematically showing the light emitting device according to the first variation of the second embodiment.

FIG. 6, FIG. 7A and FIG. 7B show the first variation of this embodiment, which is different from the embodiment in that two notches 42 are formed so that the light blocking section 22 is divided into two parts. In the light emitting device 10 having the notch 42, only the light directed toward the notch 42 tends to spread over a wide angle and the envelope of the emitted light has a partially protruding shape. In this variation, the envelope of emitted light can be improved by forming the opposed notches 42, in comparison to the embodiment having only one notch 42.

In these examples, the value of proportion of the notch 42 C/(C+D) can be calculated by assuming the length of the notch 42 as $C=C_1+C_2$ and the length of the light blocking section 22 as $D=D_1+D_2$.

The light emitting device 10 shown in FIG. 7A and FIG. 7B has the grid 44 formed between the lead frames of the bottom of the recess, so as to prevent the adhesive used in die bonding the light emitting device 28 and the protective element 30 from touching the electrically conductive wires 34. In addition, a ridge 46 is formed within the notch 42 to extend in the direction of depth of the recess 14, so as to reinforce the thinned notch 42 and increase the strength of the housing 12 as a whole. The grid 44 and the ridge 46 are preferably formed integrally with the housing 12.

Second Variation

Figure 8:
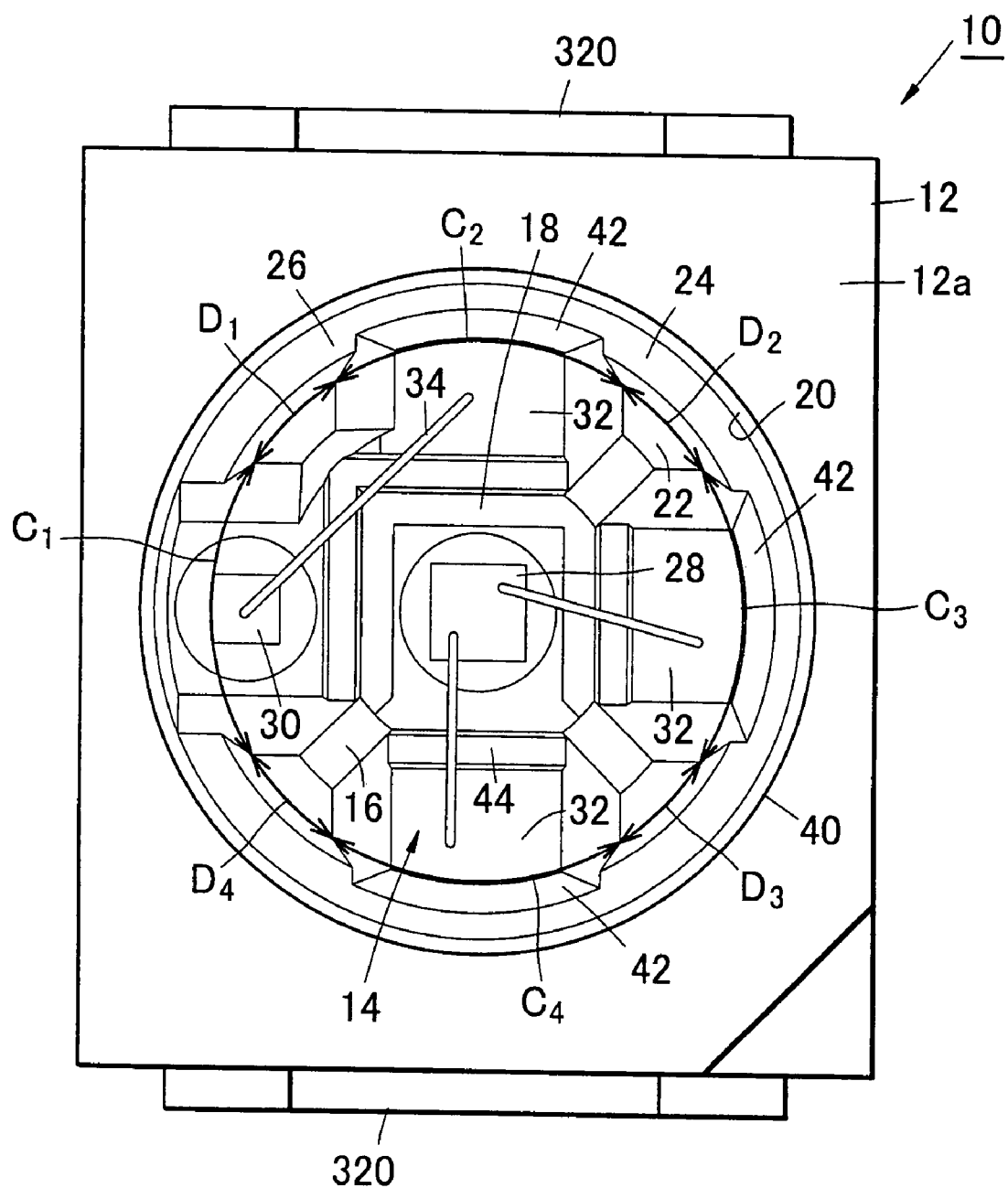
FIG. 8 is a top view schematically showing the light emitting device according to the second variation of the second embodiment.

FIG. 8 shows the second variation of this embodiment, wherein four notches 42 are formed so as to divide the light blocking section 22 into four portions. In this variation, the envelope of emitted light can be improved by disposing the four notches 42 evenly, in comparison to the embodiment having only one or two notches 42.

In this variation, the value of proportion of the notch 42 C/(C+D) can be calculated by assuming the length of the notch 42 as $C=C_1+C_2+C_3+C_4$ and the length of the light blocking section 22 as $D=D_1+D_2+D_3+D_4$.

In this variation, the grid 44 is formed between the lead frames of the bottom 18 of the recess 14, so as to prevent the adhesive used in die bonding of the light emitting device 28 and the protective element 30 from touching the electrically conductive wires 34. The grid 44 is preferably formed integrally with the housing 12.

Third Embodiment

The light emitting device 10 of the third embodiment shown in FIG. 9A through FIG. 9D is a side-emitting type light emitting device suitable for the backlight of a thin liquid crystal panel, unlike the top-emitting type light emitting device described in the first and second embodiments. Accordingly, it has the housing 12 and the lead electrodes 32 which have different configurations, but is similar to the first and second embodiments with other respects.

The housing 12 of flat shape has the recess 14 opening in the light emitting surface 12a, and the lead electrodes 32 are partially exposed on the bottom 18 of the recess 14. Disposed over the lead electrodes 32 is the light emitting element 28 die-bonded thereon and electrically connected with the lead electrodes 32 by means of the electrically conductive wires 34. The grid 44 of two parallel ridges are formed between both sides of the position of die-bonding the light emitting element 28, so as to prevent the adhesive used in die bonding of the light emitting element 28 from spreading to the position of wire bonding of the electrically conductive wires 34.

Since the lead electrodes 32 penetrate through the housing 12 and extend to the external electrodes 320, electrical power can be supplied to the light emitting element 28 by applying a voltage to the external electrodes 320. While the external electrodes 320 protrude beyond the side wall of the housing 12 in this example, the external electrodes 320 may be bent and caused to run along the housing 12 as required.

The light blocking section 22 is formed between the inner wall surface 16 of the recess 14 and the inner edge 20 of the opening, and the inner edge 20 of the opening is disposed so that the inner edge would not be illuminated directly by the light from the light emitting element 28. The light blocking section 22 is disposed so that the top thereof is lower than the light emitting surface 12a of the housing 12. Since the opening of the recess 14 is formed in a polygonal shape in this embodiment (hexagon in this example), the light blocking section 22 is formed from straight line segments running along the respective sides of the polygon.

The recess 14 is filled with the transparent sealing material to a height higher than the light blocking section 22. That is, the transparent sealing material 26 filling the recess has a height substantially equal to the light emitting surface 12a of the housing 12 which is located higher than the top of the light blocking section 22. The sealing resin 26 has the function of protecting the emitting device 28 from the environment. The recess 14 of the housing 12 is divided into the first region $R_1$ located at a position lower than the top of the light blocking section 22 and the second region $R_2$ located at a position higher than the top of the light blocking section 22.

In case the housing 12 is formed in smaller size as in this embodiment, it becomes difficult for the resin to flow into the trench 24, and air may be trapped in the sealing resin 26. It is effective in preventing such a trouble to remove a part of the light blocking section 22. While the position of removing a part of the light blocking section 22 may be determined at will, four corners of the light blocking section 22 which are located farthest from the light emitting element 28 are removed in the example shown in FIG. 9A and FIG. 9B. The material of the inner edge 20 of the opening located at larger distance from the light emitting element 28 is less likely to degrade, since the light reaching there has been scattered and decreased in intensity.

Figure 9A:
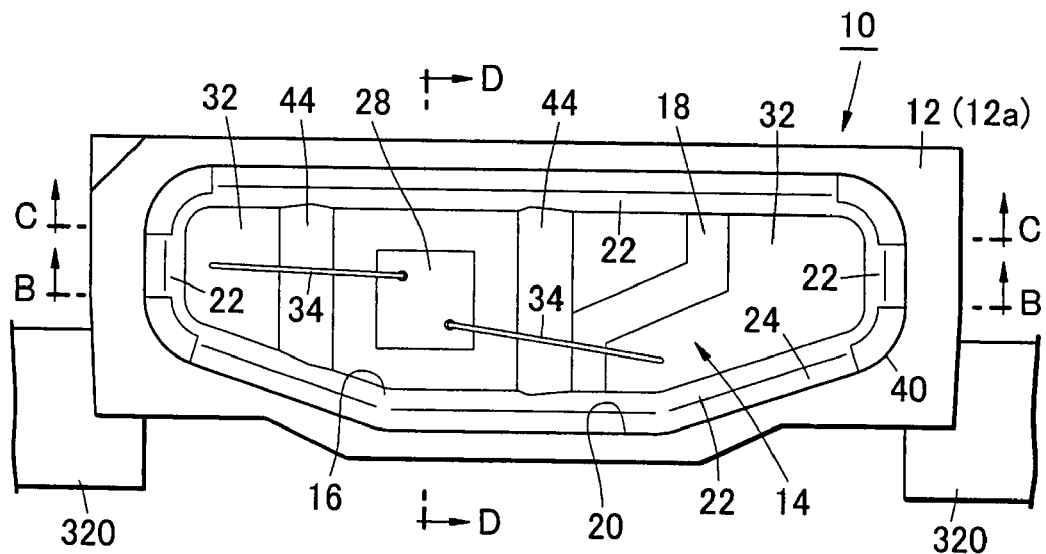
FIG. 9A is a top view schematically showing the light emitting device according to the third embodiment.
Figure 9B:
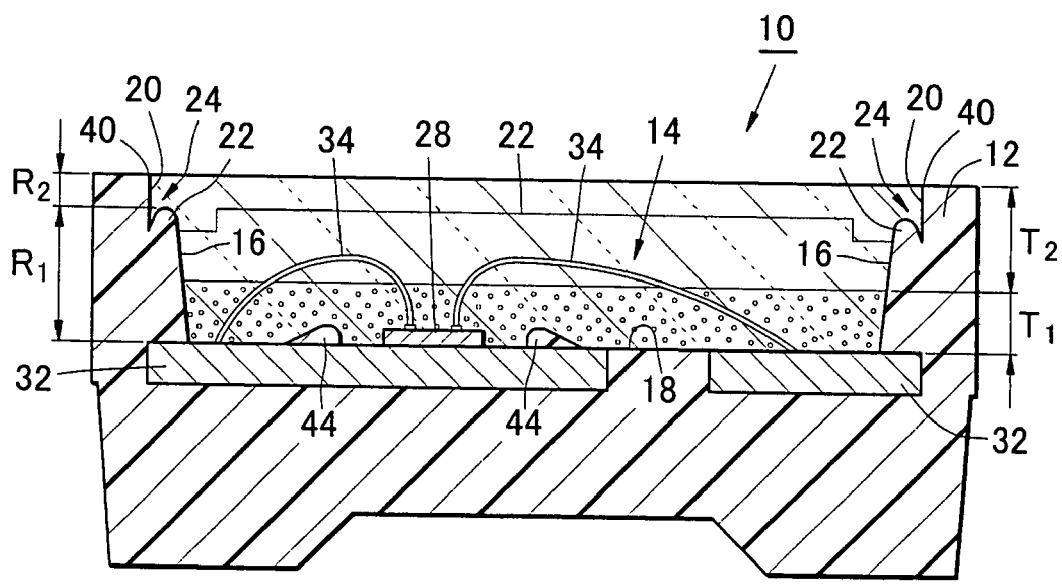
FIG. 9B is a schematic sectional view taken along lines B-B in FIG. 9A of the light emitting device according to the third embodiment.
Figure 9C:
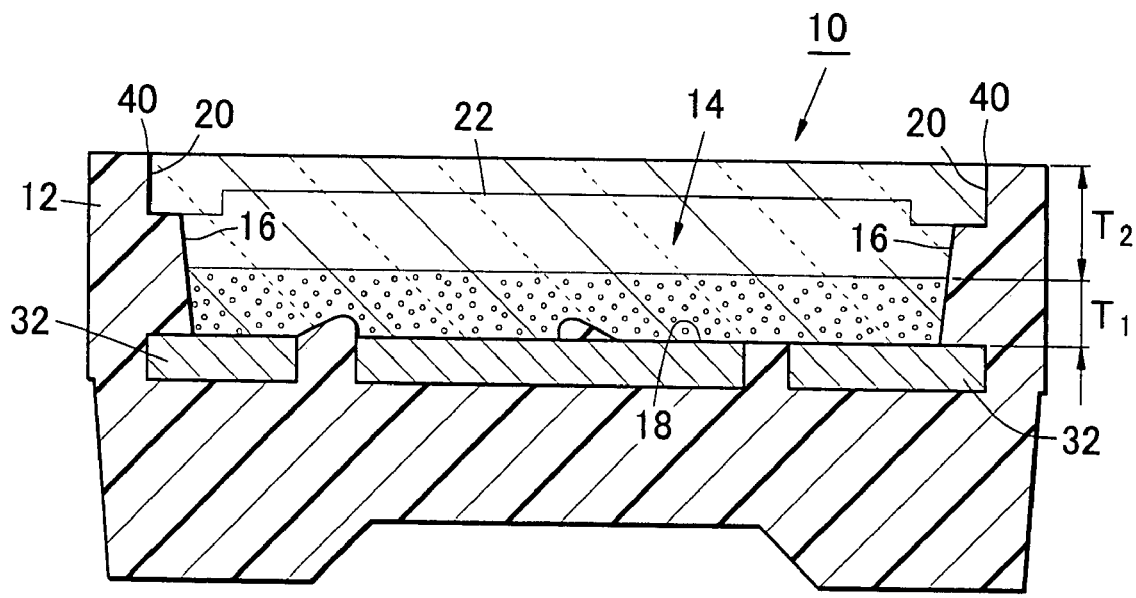
FIG. 9C is a schematic sectional view taken along lines C-C in FIG. 9A of the light emitting device according to the third embodiment.
Figure 9D:
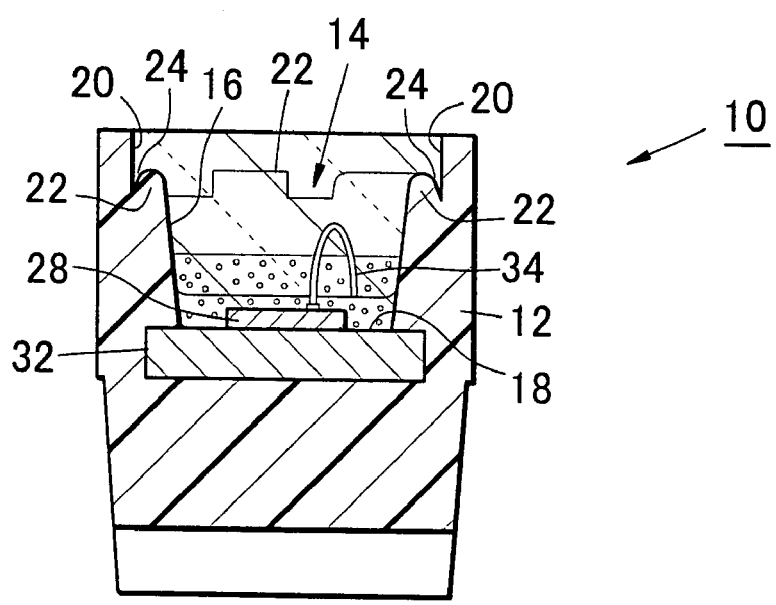
FIG. 9D is a schematic sectional view taken along lines D-D in FIG. 9A of the light emitting device according to the third embodiment.

FIG. 9C is a sectional view taken along lines C-C in FIG. 9A, the line C-C running through two of the removed corners of the light blocking section 22. As shown in FIG. 9C, a step is formed on the inner wall surface of the recess at the corners where portions of the light blocking section 22 are removed. Top surface of the step is preferably roughened, so as to improve the bonding between the housing 12 and the sealing resin 26. Top surface of the step can be roughened, for example, by roughing the mold used in forming the housing 12 on the surface corresponding to the top surface of the step by electrical discharge machining.

EXAMPLE 1

(Preparation of Specimen)

The sealing resin 26 containing fluorescent material particles was potted into the recess 14 of the housing 12 shown in FIG. 1A, and sedimentation of the fluorescent material particles was observed.

Dimensions of the recess 14 are 1.7 mm in diameter of the bottom 18, 1.8 mm in inner diameter of the top portion of the light blocking section 22, 2.1 mm in outer diameter, 0.3 mm in width at the top, 2.4 mm in diameter of the inner edge of the opening and 0.8 mm in depth from the light emitting surface 12a of the housing 12.

For the sealing resin 26, a silicone resin (specific gravity 1.4, Young's modulus 0.3 to 4 MPa, linear expansion coefficient 200 to 400 ($10^{-6}$/° C.) and viscosity 1,000 to 20,000 (mPa·s)) was used. For the fluorescent material particles, $(Y_{0.98}Gd_{0.02})_{2.85}Ce_{0.15}Al_5O_{12}$ having a mean particle size of 5.0±0.7 μm and specific gravity of 4.6 was used.

First, the light emitting device 28 and the protective element 30 were mounted by die bonding and wire bonding on the bottom 18 of the housing 12. Then the recess 14 of the housing 12 was filled with the silicone resin containing the fluorescent material particles in proportion of 19% by weight, and was left to stand still to cause the silicone resin to harden for about 17 hours.

(Observation of Specimen)

Figure 11:
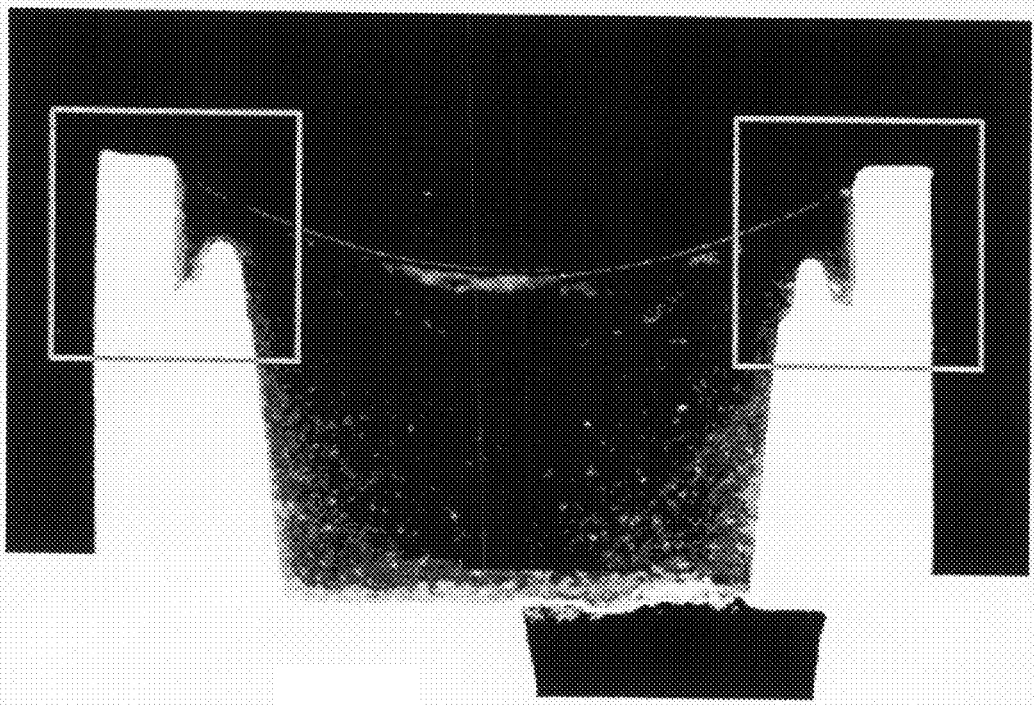
FIG. 11 is a photograph of a section of specimen according to Example 2.

The specimen obtained as described above was cut along a plane passing through the center of the recess 14, and the cut surface was observed under a metallurgical microscope (Model BX60 commercially available from Olympus Corporation), in bright field using a filter with a factor of magnification of 5. Photograph of the section is shown in FIG. 11.

(Result of Observation)

Figure 10:
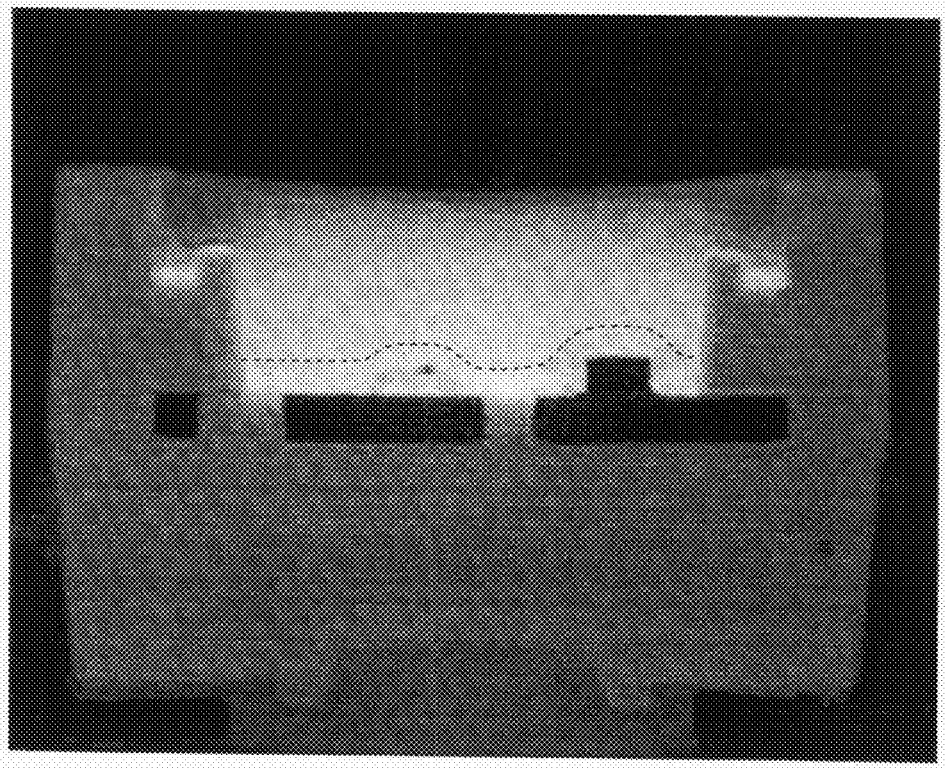
FIG. 10 is a photograph of a section of specimen according to Example 1.

In FIG. 10, the fluorescent material particles are identified as yellow granular material. FIG. 10 also shows the following facts.

Much of the fluorescent material particles sedimented on the bottom surface 18 of the recess 14, so as to form a layer of fluorescent material particles of high density (indicated by dashed line) on the bottom surface 18 of the recess 14 and on the top surfaces of light emitting device 28 and the protective element 30. This layer of fluorescent material particles corresponds to the first sealing layer 261 of the first light emitting device 10 of the present invention. Interface of the first sealing layer 261 can be more clearly observed by adjusting the use of the filter and the manner of illumination.

While the layer of fluorescent material particles has substantially uniform thickness, the first sealing layer 261 locally bulges in the portion where the light emitting device 28 and the protective element 30 are mounted. In such a case as the sealing rein locally bulges, distance between the bottom 18 and the top of the bulging portion of the first sealing layer 261 (in this example, the first sealing layer 261 formed on the protective element 30 shown on the right-hand side in the drawing) is taken as the thickness of the first sealing layer 261 defined in the present invention. The thickness of the first sealing layer 261 of the present invention can be estimated to be about 30% of the thickness of the sealing resin 26.

It is shown that the fluorescent material particles are deposited also on the inside of the trench 24 formed on the outside of the light blocking section 22. However, since light emitted by the light emitting device 10 does not directly enter the trench 24, the fluorescent material particles deposited in the trench 24 does not have influence on the problem of scattering of light which is addressed in the present invention.

In comparison to Example 2 to be described later, no significant deposition of the fluorescent material particles is observed on the inner wall surface 16 of the recess 14 in the specimen of this Example. This is presumably because, since the inner wall surface 16 of the recess 14 is formed substantially perpendicular to the bottom 18 in the housing 12 of this Example, the sealing resin 26 that contained the fluorescent material particles flowed smoothly toward the bottom 18 and was deposited on the bottom surface 18.

In case the sealing resin 26 is applied in a single step as described above, it was found that the granular additives can be distributed properly for the light emitting device of the present invention.

EXAMPLE 2

Preparation and observation of specimen

The sealing resin 26 containing the fluorescent material particles was potted into the recess 14 of the housing 12 shown in FIG. 9A, and sedimentation of the fluorescent material particles was observed.

The recess 14 has an elongated shape when viewed in the direction of the light emitting surface 12a, while the opening of the recess has a width which decreases from the center of the light emitting surface 12a toward either end and has maximum value at a position near the center. That is, when viewed in the direction of the light emitting surface 12a, one of the inner wall surfaces 16 of the recess 14 is inclined toward the other side so that the area of the light emitting surface increases from both ends of the opening up to a position of about one third of the width in the longitudinal direction of the opening, with the width having the minimum value at either end.

The bottom 18 of the recess 14 is formed with such dimensions as the length is 2.5 mm, the maximum width is 0.65 mm, the minimum width is 0.4 mm, and the depth of the bottom surface 18 from the light emitting surface 12a of the housing 12 is 0.6 mm. The inner wall surface 16 of the recess 14 is slightly inclined as a whole so that the inner diameter of the recess gradually increases from the bottom 18 to the opening 38. The light blocking section 22 formed around the inner wall surface of the recess is 0.1 mm in width and 0.08 mm in height.

In this Example, specimen was made without mounting the light emitting device 28 and the protective element 30. The same silicone resin and fluorescent material particles as those of Example 1 were used. The recess 14 of the housing was filled with the silicone resin containing the fluorescent material particles in proportion of 19% by weight, and was left to stand still to cause the silicone resin to harden for about 17 hours.

The specimen obtained as described above was cut along line D-D shown in FIG. 9A and was observed similarly to Example 1. Photograph of the section is shown in FIG. 11.

In FIG. 11, the fluorescent material particles are identified as yellow granular material. FIG. 11 also shows the following facts.

(1) Much of the fluorescent material particles sedimented on the bottom surface of the recess 14, so as to form a layer of the fluorescent material particles of high density on the bottom surface. This layer of the fluorescent material particles corresponds to the first sealing layer 261 of the first light emitting device 10 of the present invention.

(2) The fluorescent material particles are deposited also on the inner wall surface 16 of the recess 14. This is supposedly because the fluorescent material particles which came into contact with the inner wall surface 16 during sedimentation were slowed down in the sedimentation by the friction of the inner wall surface 16, and did not settle on the bottom before the sealing resin 26 hardened. As a result, the layer of fluorescent material particles appears as if it crawled up along the inner wall surface 16 from the bottom of the recess.

(3) The fluorescent material particles are deposited also on the inside of the trench 24 formed on the outside of the light blocking section 22.

The photograph of FIG. 11 shows that the fluorescent material particles which resides near the center of the recess 14 were only those included in the first sealing layer 261 of (1) described above. It was also found that the interface of the first sealing layer 261 can be clearly identified by visual observation.

Density of the fluorescent material particles is not so high in the vicinity of the inner wall surface of (2), and is therefore not considered to have sufficient effect on the scattering of light.

The fluorescent material particles deposited in the trench 24 of (3) does not have influence on the problem of scattering of light which is addressed in the present invention, since the emission does not directly reach the trench 24.

As can be seen from the above discussion, it was verified that, in case the sealing resin 26 is applied in a single step as described above, the granular additives can be distributed properly for the light emitting device of the present invention.

The light emitting device of the present invention can be used in applications that require high output power and high reliability, such as headlights and room lights of automobile.

What is claimed is:

1. A light emitting device comprising:
    a light emitting element having a pair of electrodes,
    a housing having a recess for accommodating the light emitting element,
    a first lead electrode and a second lead electrode exposed on the bottom surface of the recess,
    electrically conductive members for electrically connecting the pair of electrodes of the light emitting element with the first lead electrode and the second lead electrode respectively,
    a transparent sealing material that fills the recess, and
    granular additives contained in the sealing material,
    wherein the inner wall surface of the recess has a light blocking section which blocks light from the light emitting element directed toward the inner edge of opening of the recess, and
    wherein a quantity of the granular additives contained in the sealing material is controlled to such a level that enhances scattering of light in a first region located below the light blocking section and to such a level that suppresses scattering of light in a second region located above the light blocking section.

2. The light emitting device according to claim 1, wherein the sealing resin is a silicone resin.

3. The light emitting device according to claim 1, wherein the light blocking section has a notch formed by cutting a part thereof, and a protective element is mounted at the bottom of the recess at a position corresponding to the notch for electrically protecting the light emitting element.

4. The light emitting device according to claim 3, wherein the notch is formed such that length of the notch is not larger than 50% of the length of the light blocking section in the state without notch formed therein.

5. The light emitting device according to claim 1, wherein said inner edge of the opening of the recess is an inner wall surface of the recess in a range of up to 30% in depth of the recess, wherein the depth of the recess is the distance from an upper edge of the opening of the recess to the bottom of the recess.

6. The light emitting device according to claim 1, wherein said light blocking section is formed so as to block the light which would otherwise pass along the lines connecting the ends of the light emitting surface of the light emitting element to the upper edge of the opening of the recess.

7. The light emitting device according to claim 1, wherein said light blocking section has a height which is at least 80% of a total blocking height, wherein said total blocking height is a height which blocks the light which would otherwise pass along the lines connecting the ends of the light emitting surface of the light emitting element to the upper edge of the opening of the recess.

8. The light emitting device according to claim 1, wherein said quantity of the granular additives contained in the sealing material is controlled such that light scattered by the sealing material that fills the second region is suppressed from reaching said inner edge of the opening.

9. The light emitting device according to claim 1, wherein said lead electrodes have through holes formed in the direction of thickness thereof such that the bottom of the housing is exposed in the through holes, the through holes being formed in the vicinity of the positions where the electrically conductive members are bonded to the lead electrodes.

10. The light emitting device according to claim 1, wherein a plurality of protrusions are formed with a space from each other on top of the light blocking section.

11. The light emitting device according to claim 1, wherein a trench is formed between said inner edge of the opening of the recess and the light blocking section.

12. The light emitting device according to claim 1, wherein said granular additives include a fluorescent material which absorbs blue light emitted by said light emitting element, and emits yellow light.

13. The light emitting device according to claim 1, wherein said granular additives include a fluorescent material which emits light in a range from green to yellow, a fluorescent material which emits blue light and a fluorescent material which emits red light.

14. The light emitting device according to claim 1, wherein said granular additives include a dispersant capable of causing the light emitting device to emit light in an isotropic pattern by scattering light from the light emitting element.

15. The light emitting device according to claim 1, wherein said granular additives include a granular oxide which has the effect of decreasing the linear expansion coefficient of the sealing material so as to mitigate the thermal stress acting on the sealing material and improve the mechanical strength of the sealing material.

16. A light emitting device comprising:
a light emitting element having a pair of electrodes,
a housing having a recess for accommodating the light emitting element,
a first lead electrode and a second lead electrode exposed on the bottom surface of the recess,
electrically conductive members for electrically connecting the pair of electrodes of the light emitting element with the first lead electrode and the second lead electrode respectively,
a transparent sealing material that fills the recess, and
granular additives contained in the sealing material,
wherein the inner wall surface of the recess has a light blocking section which blocks light from the light emitting element directed toward the inner edge of opening of the recess,
the portion of the sealing member located on the side of the bottom of the recess is a sealing layer which contains the granular additives, and
wherein the thickness of the sealing layer is in a range from 10% to 80% of the thickness of the sealing material, and top surface of the sealing layer is located lower than the top of the light blocking section.

17. The light emitting device according to claim 16, wherein the sealing layer contains the granular additives in the proportion $T_1/(T_1+T_2)$ of the thickness $T_1$ of sealing layer to the thickness $T_1 + T_2$ of the sealing material.

18. A light emitting device comprising:
a light emitting element having a pair of electrodes,
a housing having a recess for accommodating the light emitting element,
a first lead electrode and a second lead electrode exposed on the bottom surface of the recess,
electrically conductive members for electrically connecting the pair of electrodes of the light emitting element with the first lead electrode and the second lead electrode respectively,
a transparent sealing material that fills the recess, and
granular additives contained in the sealing material,
wherein the inner wall surface of the recess has a light blocking section which blocks light from the light emitting element directed toward the inner edge of opening of the recess,
wherein maximum density of the granular additives having particle size of 2.0 µm or larger contained in the sealing material is lower in the second region located above the light blocking section than in the first sealing layer located below the light blocking section, and
wherein the maximum density of the granular additives contained in the second region is not higher than 80% of the maximum density of the granular additives in the first region.

19. The light emitting device according to claim 18, wherein the granular additives contain fluorescent material particles which absorb the light emitted by the light emitting device and emit light of a different wavelength,
the maximum density of the fluorescent material particles having particle size of 2.0 µm or larger is lower in the second region than in the first sealing layer, and
wherein the maximum density of the fluorescent material particles contained in the second region is not higher than 50% of the maximum density of the fluorescent material particles in the first region.

* * * * *